United States Patent
Eguchi et al.

(10) Patent No.: US 9,041,070 B2
(45) Date of Patent: May 26, 2015

(54) VERTICAL POWER MOSFET

(71) Applicant: RENESAS ELECTRONICS CORPORATION, Kanagawa (JP)

(72) Inventors: Satoshi Eguchi, Kanagawa (JP); Yoshito Nakazawa, Kanagawa (JP); Tomohiro Tamaki, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/109,208

(22) Filed: Dec. 17, 2013

(65) Prior Publication Data

US 2014/0191309 A1 Jul. 10, 2014

(30) Foreign Application Priority Data

Jan. 7, 2013 (JP) ................................. 2013-000384

(51) Int. Cl.
*H01L 29/66* (2006.01)
*H01L 29/06* (2006.01)
*H01L 29/78* (2006.01)

(52) U.S. Cl.
CPC ........ *H01L 29/0619* (2013.01); *H01L 29/0626* (2013.01); *H01L 29/0696* (2013.01); *H01L 29/7802* (2013.01)

(58) Field of Classification Search
USPC ......... 257/341, 342, 401, 491, 492, 493, 496, 257/282, 288, 302, 328, 329
See application file for complete search history.

(56) References Cited

U.S. PATENT DOCUMENTS

| 6,888,195 | B2 | 5/2005 | Saito et al. | |
|---|---|---|---|---|
| 7,230,297 | B2 * | 6/2007 | Ono et al. | 257/330 |
| 8,097,511 | B2 * | 1/2012 | Shibata et al. | 438/270 |
| 2009/0302373 | A1 * | 12/2009 | Tokano et al. | 257/328 |
| 2011/0241111 | A1 * | 10/2011 | Tamaki et al. | 257/342 |
| 2012/0299094 | A1 * | 11/2012 | Lee et al. | 257/341 |

FOREIGN PATENT DOCUMENTS

| JP | 2003-229569 A | 8/2003 |
|---|---|---|
| JP | 2004-119611 A | 4/2004 |
| JP | 2011-216587 A | 10/2011 |

* cited by examiner

*Primary Examiner* — Wael Fahmy
*Assistant Examiner* — Wasiul Haider
(74) *Attorney, Agent, or Firm* — Mattingly & Malur, PC

(57) ABSTRACT

When forming a super junction by the embedded epitaxial method, adjusting a taper angle of dry etching to form an inclined column is generally performed in trench forming etching, in order to prevent a reduction in breakdown voltage due to fluctuations in concentration in an embedded epitaxial layer. However, according to the examination by the present inventors, it has been made clear that such a method makes design more and more difficult in response to the higher breakdown voltage. In the present invention, the concentration in an intermediate substrate epitaxy column area in each substrate epitaxy column area configuring a super junction is made more than that in other areas within the substrate epitaxy column area, in a vertical power MOSFET having the super junction by the embedded epitaxial method.

11 Claims, 29 Drawing Sheets

VERTICAL POWER MOSFET

CROSS-REFERENCE TO RELATED APPLICATION

The disclosure of Japanese Patent Application No. 2013-000384 filed on Jan. 7, 2013 including the specification, drawings and abstract is incorporated herein by reference in its entirety.

BACKGROUND

The present invention relates to a semiconductor device (or semiconductor integrated circuit device) and can be applied to, for example, a power semiconductor device such as a power MOSFET.

Japanese Patent Laid-Open No. 2004-119611 (Patent Document 1) relates to a vertical power MOSFET having a super junction. Patent Document 1 discloses the technology to prevent a reduction in breakdown voltage due to the charge balance with an N-type drift area, by controlling the concentration distribution in a P-type drift area so that the concentration lowers toward deeper positions.

Japanese Patent Laid-Open No. 2003-229569 (Patent Document 2) also relates to a vertical power MOSFET having a super junction in the same way as in Patent Document 1. Patent Document 2 discloses the technology to perform embedded epitaxial growth at temperature not less than 800 degrees Celsius and not more than 1,000 degrees Celsius and at pressure not less than 1333.22 pascals and not more than 13332.2 pascals, by somewhat inclining the trench so as to leave no voids and by using dichlorosilane as a source gas.

Japanese Patent Laid-Open No. 2011-216587 (Patent Document 3) or US Patent Publication No. 2011-241111 (Patent Document 4) corresponding thereto also relates to a vertical power MOSFET having a super junction in the same way as in Patent Documents 1 and 2. Patent Document 3 and Patent Document 4 disclose the technology to make the concentration larger toward the surface side by forming a substrate side N-type epitaxial layer into a multilayer structure in order to compensate for the loss of charge balance resulting from the spread due to thermal treatment of the P-type drift area.

SUMMARY

When forming a super junction by the embedded epitaxial method, adjusting a taper angle of dry etching to form an inclined column is generally performed in trench forming etching, in order to prevent a reduction in breakdown voltage due to fluctuations in concentration in an embedded epitaxial layer. However, according to the examination by the present inventors, it has been made clear that such a method makes design more and more difficult in response to the higher breakdown voltage.

While the means for solving the above-described problems are described below, the other problems and the new feature will become clear from the description of the present specification and the accompanying drawings.

The following explains briefly the outline of a typical embodiment among the embodiments disclosed in the present application.

That is, the outline of one embodiment of the present application is such that in the vertical power MOSFET having the super junction by the embedded epitaxial method, the concentration in the intermediate substrate epitaxy column area in each substrate epitaxy column area configuring the super junction is made more than that in other areas within the substrate epitaxy column area.

The following explains briefly the effect obtained by the typical embodiment among the embodiments disclosed in the present application.

That is, according to the one embodiment of the present application, it is possible to prevent a reduction in breakdown voltage or the like due to fluctuations in concentration in the embedded epitaxy column area configuring the super junction.

DETAILED DESCRIPTION

Outline of the Embodiment

Figure 1:
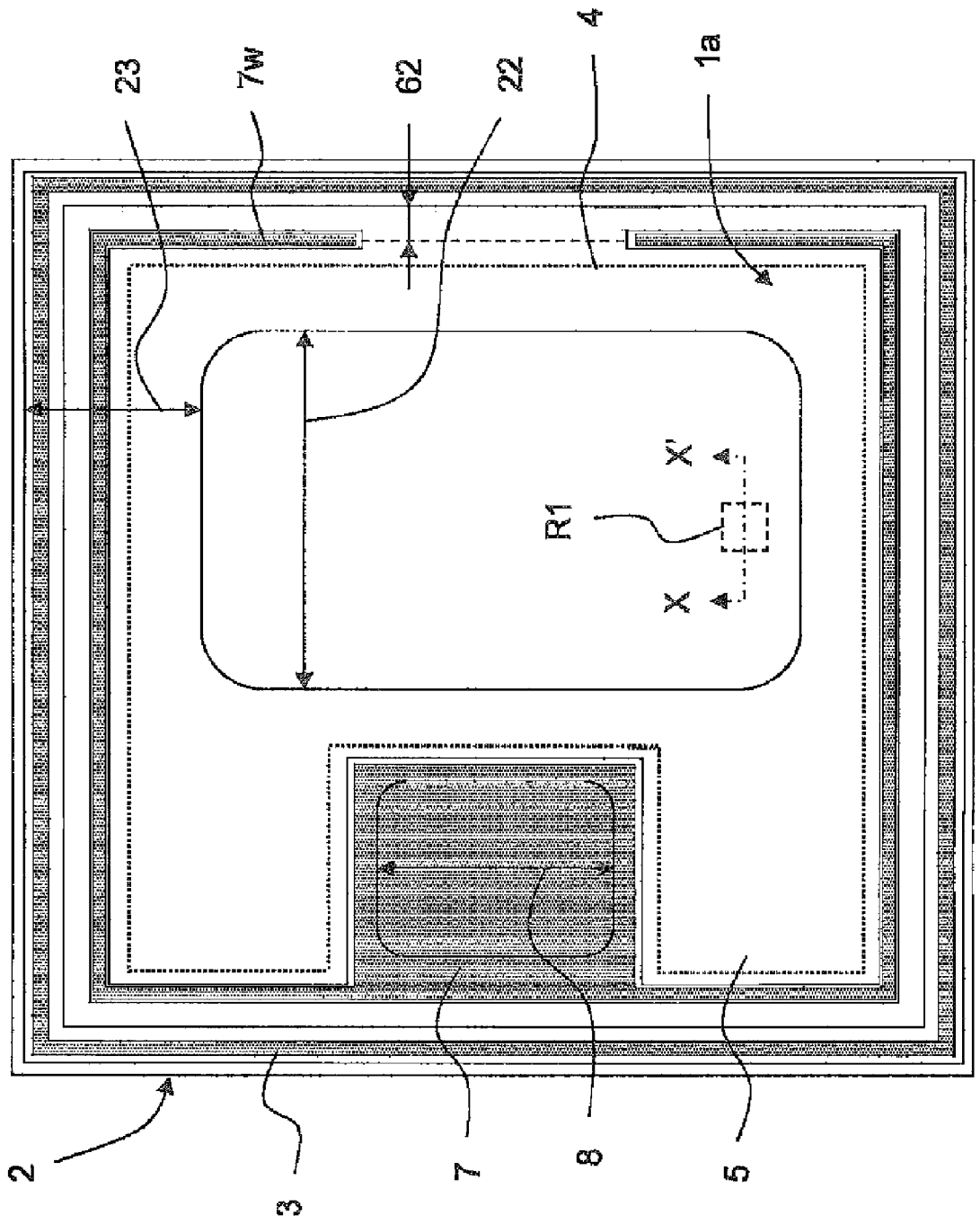
FIG. 1 is a general top view of a semiconductor chip for explaining an example or the like of a device structure in a vertical power MOSFET of one embodiment of the present application.

First, the outline of a typical embodiment disclosed in the present application will be explained.

1. A vertical power MOSFET including:

(a) a semiconductor substrate having a first main surface and a second main surface;

(b) a cell area provided extending from the first main surface side to the inside of the semiconductor substrate;

(c) a first conductive-type substrate part provided extending from the second main surface of the semiconductor substrate into the inside;

(d) a drift area located within the cell area, which is formed extending from an upper end of the substrate part to the first main surface of the semiconductor substrate, and which has a super junction structure;

(e) a large number of substrate epitaxy column areas having a first conductive type and configuring the super junction structure;

(f) a large number of embedded epitaxy column areas having a second conductive type opposite to the first conductive type and configuring the super junction structure;

(g) a metal source electrode provided over the first main surface of the semiconductor substrate; and (h) a metal drain electrode provided over the second main surface of the semiconductor substrate, and here, each substrate epitaxy column area includes the following areas:

(e1) an intermediate substrate epitaxy column area located in an intermediate area in the depth direction of the semiconductor substrate;

(e2) an upper substrate epitaxy column area located closer to the first main surface side than the intermediate substrate epitaxy column area; and (e3) a lower substrate epitaxy column area located closer to the second main surface side than the intermediate substrate epitaxy column area. Furthermore, the concentration in the intermediate substrate epitaxy column area is made more than that in other portions within the substrate epitaxy column area.

2. In the vertical power MOSFET of the above-described item 1, (x1) each substrate epitaxy column area includes the intermediate substrate epitaxy column area, the upper substrate epitaxy column area, and the lower substrate epitaxy column area;

(x2) the impurity concentration in the intermediate substrate epitaxy column area is more than the impurity concentration in the lower substrate epitaxy column area; and (x3) the impurity concentration in the lower substrate epitaxy column area is equal to or more than the impurity concentration in the upper substrate epitaxy column area.

3. In the vertical power MOSFET of the above-described item 1 or 2, setting is performed so that when avalanche breakdown is generated in any area of the large number of substrate epitaxy column areas, the avalanche breakdown is generated in the intermediate substrate epitaxy column area of the substrate epitaxy column area.

4. In any one vertical power MOSFET of the above-described items 1 to 3, (y1) the thickness of the upper substrate epitaxy column area in each substrate epitaxy column area is equal to or less than half the total thickness of the substrate epitaxy column area;

(y2) the thickness of the intermediate substrate epitaxy column area in each substrate epitaxy column area is equal to or more than the thickness of the lower substrate epitaxy column area; and (y3) the thickness of the intermediate substrate epitaxy column area in each substrate epitaxy column area is equal to or less than the thickness of the upper substrate epitaxy column area.

5. In any one vertical power MOSFET of the above-described items 1 to 4, at least a part of a side surface from an upper end part to an intermediate part in each substrate epitaxy column area is provided with a column side surface ion implantation area having the second conductive type.

6. In any one vertical power MOSFET of the above-described items 1 to 5, each substrate epitaxy column area has a taper angle of not less than 88.6 degrees and not more than 89.6 degrees.

7. In any one vertical power MOSFET of the above-described items 1 to 5, each substrate epitaxy column area has a taper angle of not less than 88.6 degrees and not more than 89.3 degrees.

8. In any one vertical power MOSFET of the above-described items 1 to 7, the semiconductor substrate is a silicon-based semiconductor substrate.

9. A vertical power MOSFET including:

(a) a semiconductor substrate having a first main surface and a second main surface;

(b) a cell area provided extending from the first main surface side to the inside of the semiconductor substrate;

(c) a first conductive-type substrate part provided extending from the second main surface of the semiconductor substrate into the inside;

(d) a drift area located within the cell area, being formed extending from an upper end of the substrate part to the first main surface of the semiconductor substrate, and having a super junction structure;

(e) a large number of substrate epitaxy column areas having a first conductive type and configuring the super junction structure;

(f) a large number of embedded epitaxy column areas having a second conductive type opposite to the first conductive type and configuring the super junction structure;

(g) a metal source electrode provided over the first main surface of the semiconductor substrate; and (h) a metal drain electrode provided over the second main surface of the semiconductor substrate. In each substrate epitaxy column area, at least a part of a side surface from an upper end part to an intermediate part is provided with a column side surface ion implantation area having the second conductive type.

10. In the vertical power MOSFET of the above-described item 9, each substrate epitaxy column area has a taper angle of not less than 88.6 degrees and not more than 89.6 degrees.

11. In the vertical power MOSFET of the above-described item 9 or 10, each substrate epitaxy column area has a taper angle of not less than 88.6 degrees and not more than 89.3 degrees.

12. In any one vertical power MOSFET of the above-described items 9 to 11, the semiconductor substrate is a silicon-based semiconductor substrate.

[Explanation of Description Format, Basic Terms, Usage in the Present Application]

1. In the present application, there is a case where embodiments are described, divided into plural parts and sections for convenience if necessary. Except for the case where it shows otherwise clearly in particular, they are not mutually independent or separate and in each portion of a single example, one has relationships such as partial details or a modification of some or entire of another. As a principle, the similar portions are not repeated. Each element in the embodiment is not indispensable, except for the case where it is clearly specified otherwise in particular, where it is considered to be clearly restricted to a specific number theoretically, and where it is clearly not right from its context.

Furthermore, when referring to a "semiconductor device" in the present application, it refers to a single body of various kinds of transistors (active elements), one in which resistors, capacitors or the like are integrated over a semiconductor chip or the like (for example, a single crystal silicon substrate) with a transistor as a center, and one in which semiconductor chips or the like are packaged. Here, as a typical one of the various kinds of transistors, there can be illustrated MISFET (Metal Insulator Semiconductor Field Effect Transistor) represented by MOSFET (Metal Oxide Semiconductor Field Effect Transistor) as an example. As a typical one of the various kinds of single body transistors, there can be illustrated a power MOSFET and IGBT (Insulated Gate Bipolar Transistor) as an example.

In the present application, a "semiconductor active element" refers to a transistor, a diode, or the like.

In general, a semiconductor element for high power use capable of handling several watts or more is referred to as a power semiconductor element or a power semiconductor device. The power MOSFET mainly handled in the present application belongs to the power semiconductor device and is roughly classified into the vertical power MOSFET and the lateral power MOSFET. Generally, in the lateral power MOSFET, the source electrode and the drain electrode are located on the surface of the chip, and in the vertical power MOSFET, the source electrode is located on the surface of the chip and the drain electrode is located on the back side.

The vertical power MOSFET is further classified into the planar-type power MOSFET, the trench-type power MOSFET, or the like, and the planar-type power MOSFET has an advantage that one having a high breakdown voltage is easily manufactured and the trench-type power MOSFET has an advantage that one having a low on-resistance is easily manufactured. In the following embodiment, the planar-type power MOSFET will be mainly taken as an example and explained specifically, but it is needless to say that the structure or the like explained in the present application can be similarly applied to the trench-type power MOSFET.

2. Similarly, in the description of the embodiment or the like, the wording "X including A" as to a material, composition, etc., does not exclude one which has an element other than A as one of its main elements except for the case where it is clearly specified otherwise in particular and where it is clearly not right from its context. For example, it means "X including A as its main component" as to the component. For example, a "silicon member", a "silicon-based member", etc., are not limited to pure silicon and it is needless to say that a SiGe alloy, a multi-element alloy containing silicon as its main component, and a member including another additive, etc., are also included.

For example, a "silicon-based semiconductor substrate" is not limited to one including the silicon substrate, over which general-purpose impurities such as phosphorus, arsenic, antimony, and boron, are introduced into the epitaxial area, the embedded epitaxial area, and other impurity-doped areas, and the substrate in which carbon (from zero up to about several atomic %), germanium (from zero up to about 35 atomic %) and the like are added to the above is also included.

Similarly, a "silicon oxide film", "silicon oxide-based insulating film", etc., also include insulating films containing, as its main component, not only a comparatively pure undoped silicon dioxide but also another silicon oxide. For example, the silicon oxide-based insulating film doped with impurities such as TEOS-based silicon oxide, PSG (Phosphorus Silicate Glass), and BPSG (Borophosphosilicate Glass), is also the silicon oxide film. Furthermore, the coated film of SOG (Spin On Glass), NSC (Nano-Clustering Silica) or the like is also the silicon oxide film or the silicon oxide-based insulating film, besides the thermal oxide film and the CVD oxide film. In addition, the Low-k insulating film of FSG (Fluorosilicate Glass), SiOC (Silicon Oxicarbide), carbon-doped silicon oxide, OSG (Organosilicate Glass) or the like is also the silicon oxide film or the silicon oxide-based insulating film. Moreover, the silica-based Low-k insulating film in which pores are introduced into the same member as that described above is also the silicon oxide film or the silicon oxide-based insulating film (when referring to a porous insulating film and "porous", a molecular porous insulating film and "molecular porous" are also included).

Furthermore, along with the silicon oxide-based insulating film, as a silicon-based insulating film commonly used in the field of semiconductor, there is a silicon nitride-based insulating film. Materials belonging to this group include SiN, SiCN, SiNH, SiCNH, or the like. Here, when referring to "silicon nitride", it includes both SiN and SiNH except for the case where it is clearly specified otherwise in particular. Similarly, when referring to "SiCN", it includes both SiCN and SiCNH except for the case where it is clearly specified otherwise in particular.

Meanwhile, SiC has properties similar to those of SiN, and SiON is rather classified as a silicon oxide-based insulating film in many cases, but when it is used as an etch stop film, it is close to SiC, SiN, or the like.

The silicon nitride film is frequently used as an etch stop film in the SAC (Self-Aligned Contact) technique, that is, as a CESL (Contact Etch-Stop Layer) and is also used as a stress-applying film in the SMT (Stress Memorization Technique).

3. Similarly, appropriate examples of figures, positions, attributes, etc., are shown, but it is needless to say that they are not limited strictly to the appropriate examples except for the case where it is clearly specified otherwise in particular and where it is clearly not right from its context. Consequently, for example, a "square" includes a figure substantially in the shape of a square, "perpendicular" includes substantially perpendicular, and "to agree with" includes "to substantially agree with". This also applies to "parallel" and "right angle". Consequently, for example, a state that deviates about ten degrees from the perfect parallel state substantially belongs to the parallel state. However, this shall not apply to the case of referring to the "vertical column" or the like as to the taper angle of the column or trench. The reason is that an angle as small as about 5 to 6 degrees includes a plurality of classifications as to inclination as described below.

In addition, when referring to "entire", "general", "entire area", or the like, as to a certain area, "substantially entire", "substantially general", "substantially entire area", or the like are included. Consequently, for example, 80% or more of a certain area can be regarded as "substantially entire", "substantially general", and "substantially entire area". This also applies to the "entire circumference", "entire length", or the like.

Furthermore, when referring to the shape of something as "rectangular", "substantially rectangular" is included. Consequently, for example, when the area of the portion different from a rectangle is less than about 20% of the entire area, the shape can be regarded as substantially rectangular. This also applies to "annular" or the like.

In addition, as to periodicity, "periodic" includes "substantially periodic" and as to each individual element, when the deviation in the period is less than about 20%, each individual element can be regarded as "substantially periodic". Furthermore, when the number of elements beyond this range is less than about 20% of all the elements as to periodicity, the elements can be regarded as "substantially periodic" as a whole.

Meanwhile, definitions in the present section are general ones and if there is a different definition in each individual description below, priority is given to each individual description as to the definition. However, as to the definition not defined in the individual description, the definition, regulation and the like in the present section are still effective except for the case where they are denied clearly.

4. Moreover, when referring to a specific numeric value or number, it may be a numeric value greater than the specific numeric value or a numeric value less than the specific numeric value except for the case where it is clearly specified otherwise in particular, where it is clearly restricted to the number theoretically, and where it is clearly not right from its context.

5. When referring to a "wafer", normally, a single crystal silicon wafer over which a semiconductor device (also semiconductor integrated circuit device and electronic device) is formed is referred to, but it is needless to say that the epitaxial wafer, the composite wafer or the like of the insulating substrate such as the SOI substrate and the LCD glass substrate, and the semiconductor layer or the like are also included.

6. In general, the super junction structure is a structure in which into a semiconductor area of certain conductive type, cylindrical or plate-shaped column areas of the opposite conductive type are inserted substantially at regular intervals in such a manner that the charge balance is maintained. When referring to the "super junction structure" by the trench fill method (also referred to as "embedded epitaxial method") in the present application, as a principle, the structure is one in which into a semiconductor area of certain conductive type, plate-shaped (normally, in the shape of a flat plate, but, may be in the curved or bent shape) "column areas" of the opposite conductive type are inserted substantially at regular intervals in such a manner that the charge balance is maintained. In the embodiment, a structure formed by placing P-type columns in parallel at regular intervals in an N-type semiconductor layer (for example, a drift area) will be explained. In addition, the thickness of the P-type column at each portion may differ from one another from location to location, but in the case where the structure is manufactured by the trench fill method, it is preferable that the thickness (width) is equal to one another. The reason is that when the trench width is different, the embedment characteristics differ from part to part.

As the super junction structure explained in the present application, one penetrating through the drift area will be mainly taken as an example and explained specifically, but it is needless to say that one not penetrating through the drift area may be accepted.

Meanwhile, in the present application, there is a case where a drift area not having the super junction structure is referred to as a single conductive-type drift area.

As the manufacturing method of the super junction structure, for example, the multi-epitaxial method exists in addition to the embedded epitaxial method. Compared to the multi-epitaxial method, the embedded epitaxial method has an advantage of the simplified process.

In the super junction structure, the "orientation" refers to a longitudinal direction when the P-type column or N-type column configuring the super junction structure is viewed in the two-dimensional manner in correspondence to the main surface of the chip (in the surface parallel to the main surface of the chip or wafer).

In addition, the "peripheral super junction structure" refers to the super junction structure provided in the peripheral outer area of the active cell area, that is, in the junction edge termination area. In contrast, the super junction structure provided in the cell area is referred to as the "cell area super junction structure". In the present application, the cell area super junction structure will be explained mainly, but it is needless to say that the structure may have the peripheral super junction structure.

In contrast, the guard ring in the chip peripheral area refers to a field plate being substantially in the shape of a ring (from a viewpoint of action, a reverse field plate) and being electrically coupled to the semiconductor substrate (for example, the drain potential) thereunder. Meanwhile, in the present application, "the shape of a ring (annular)" normally refers to the shape of a closed loop (the shape of a loop may be substantially the shape of a rectangular ring, substantially the shape of a circular ring, or substantially the shape of an elliptic ring), but the shape of a ring is not necessary to be strictly in a closed state and it is sufficient if the shape of a ring is in a closed state in terms of the outer shape. That is, an array in the shape of a ring of conductors separating from one another may be accepted. Meanwhile, it is needless to say that the shape of a closed loop is preferable in terms of the breakdown voltage characteristics.

Furthermore, in the present application, a "rectangle" or "rectangular shape" refers to substantially the shape of a square or rectangle, and the shape may have concavities and convexities with a comparatively small area relative to the entire area and the shape may be subjected to rounding, chamfering processing, or the like. Meanwhile, as to the rectangle, "the orientation is the same" means that at least one of the axes of rotational symmetry as a corresponding planar figure is substantially the same. In other words, it means that the sides corresponding to each other are substantially parallel.

Moreover, in the present application, "local charge balance is maintained" means that the charge balance is maintained in the range of distance corresponding to approximately the thickness of the column, when, for example, the chip main surface is viewed in a planar manner.

Meanwhile, in the present application, when referring to the "breakdown voltage" and "breakdown voltage characteristics", they mean the source-drain breakdown voltage as to the power MOSFET except for the case where it is specified otherwise in particular.

7. In the present application, when it is stated that "A is higher in concentration than B" in the impurity areas, in general, both the peak concentrations are compared in the case where the change in concentration according to the position such as depth, is large. In the case where the concentration changes comparatively gradually or where the flat portion is dominant as a whole in concentration, the typical value, such as the average value, is set to be the reference. In these cases, the concentration refers to the so-called net doping concentration.

Furthermore, in the present application, the "substrate epitaxial growth" means the uniform epitaxial growth over the semiconductor substrate. In contrast to this, the "embedded epitaxial growth" means embedding the concave portions over the backing substrate having large concavities and convexities (the depth of the concave portion is larger than the width of the concave portion) by epitaxial growth. In addition, the column area formed by the embedded epitaxial growth is referred to as an "embedded epitaxy column area" and the column area formed by processing, through the use of dry etching or the like, the flat epitaxial growth layer formed by the substrate epitaxial growth is referred to as a "substrate epitaxy column area".

In relation to this, the method for configuring the super junction structure by using the column of one conductive type as the substrate epitaxy column area, and the column of the other conductive type as the embedded epitaxy column area is referred to as the "trench fill method" or "embedded epitaxial method".

Furthermore, in the present application, as to the taper angle (the range of values is taken to be 90.0 degrees or less and the average value is calculated to three significant figures) of the P column or N column configuring the super junction, the "vertical column" refers to a column having a taper angle in the range between 90.0 degrees and 89.7 degrees. Similarly, the "minutely inclined column" refers to a column having a taper angle in the range between 89.6 degrees and 88.0 degrees. In addition, the "normally inclined column" refers to a column having a taper angle in the range between 87.9 degrees and 85.0 degrees (degrees equal to or less than 84.9 degrees are excluded because they are not practical). Note that when simply referring to the "inclined column", both the minutely inclined column and the normally inclined column are included.

As to the half-width of each column, a half cross-sectional total charge amount, that is, a P column half cross-sectional total charge amount Qp and an N column half cross-sectional total charge amount Qn refer to the total charge amount (net dopant) of the plate-shaped portion having a unit thickness at a predetermined height of one column of interest.

The "charge imbalance ratio" refers to a ratio of 2×(P column half cross-sectional total charge amount Qp−N column half cross-sectional total charge amount Qn)/(P column half cross-sectional total charge amount Qp+N column half cross-sectional total charge amount Qn) expressed by percent.

Details of the Embodiment

The embodiment is explained in more detail. In each drawing, the same or similar symbol reference numeral is attached to the same or similar portion and explanation is not repeated as a principle.

In the accompanying drawings, in the case where the drawing becomes complicated on the contrary or where the distinction from the vacant space is clear, hatching or the like may be omitted even if it is a cross-sectional view. In relation to this, in the case where it is clear from explanation or the like, the background contour line may be omitted even if it is a closed hole in a planar manner. Further, even if it is not a cross-sectional view, hatching may be given in order to clearly indicate that it is not a vacant space.

As to the designation in the case of two alternatives, when one of the alternatives is referred to as "first one" or the like and the other is referred to as "second one" or the like, there is a case where the two alternatives are illustrated by being associated with each other in accordance with a typical embodiment, but it is needless to say that the alternative is not limited to the illustrated one even if it is referred to as the "first" alternative.

1. Explanation of an Example or the Like of a Device Structure (Multilayer N Epitaxy Layer Structure) in a Vertical Power MOSFET of One Embodiment of the Present Application (See FIG. 1 to FIG. 3 Mainly)

Hereinafter, a structure in which a device is formed over a silicon single crystal substrate (including the epitaxial substrate) or the like, that is, over a silicon-based semiconductor substrate is mainly taken as an example and specifically explained, but the following example is not limited to that and it is needless to say that the explanation can also be applied to the structure in which a device is formed over a SiC-based semiconductor substrate or another semiconductor substrate.

In addition, here, the single device will be mainly taken as an example and explained specifically, but it is needless to say that the explanation can also be applied to the semiconductor integrated circuit device or the like in which, for example, the power MOSFET, the control circuit or the like, are incorporated into the same chip. Furthermore, in the present application, it is assumed that such a composite device is included in the "power MOSFET".

Although needless to say, IPM (Intelligent Power Module) in which the control circuit device or the like is incorporated into one package together with the power MOSFET is included in the "power MOSFET" in the present application.

In the following example, a planar-type power MOSFET is taken as an example and explained specifically, but it is needless to say that the explanation can also be applied to a trench gate power MOSFET similarly.

In this example, the planar-type power MOSFET formed on the silicon-based semiconductor substrate and whose source-drain breakdown voltage is about 600 V is taken as an example and explained specifically (the planar-type power MOSFET is the same in the following section), but it is needless to say that the explanation can also applied to the power MOSFET having another breakdown voltage and other devices. Note that the main range of breakdown voltage is between about 30 V and 1,500 V in the case of the silicon-based semiconductor and it is particularly preferable that the range is between about 300 V and 1,200 V.

A planar gate power MOSFET explained in this section is somewhat disadvantageous in terms of on-resistance compared to a trench gate power MOSFET, but has advantages of ease of manufacturing of the high breakdown voltage structure, also the excellent switching characteristics and the like.

In the present application, the N channel device is mainly taken as an example and will be explained specifically in the specific explanation, but it is needless to say that the explanation can also be applied to the P channel device.

Figure 2:
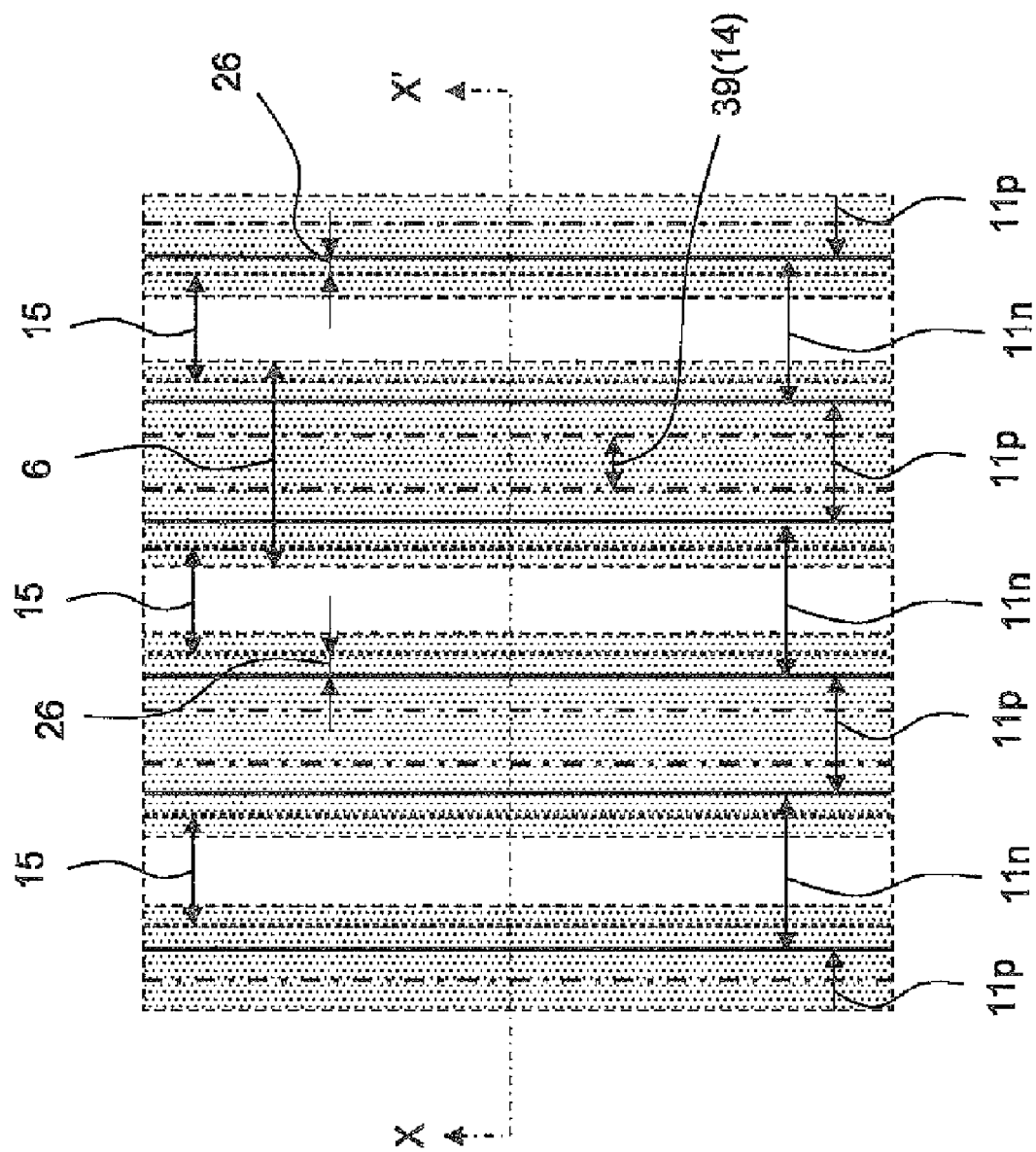
FIG. 2 is an enlarged plan view of a cell part cutout area R1 in FIG. 1.
Figure 3:
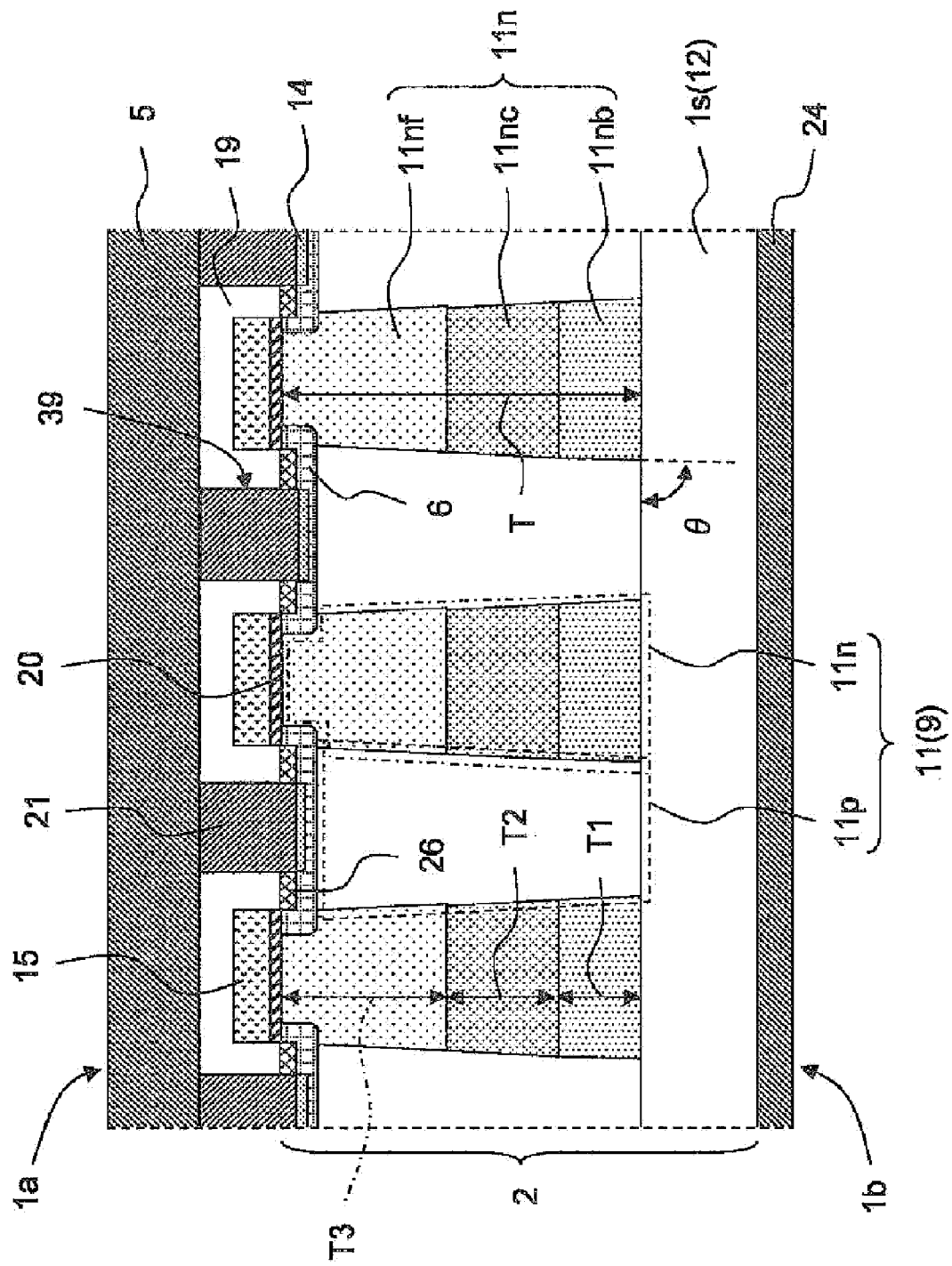
FIG. 3 is a device cross-sectional view corresponding to an X-X' section in FIG. 2.

FIG. 1 is a general top view of a semiconductor chip for explaining an example or the like of a device structure in a vertical power MOSFET of one embodiment of the present application. FIG. 2 is an enlarged plan view of a cell part cutout area R1 in FIG. 1. FIG. 3 is a device cross-sectional view corresponding to an X-X' section in FIG. 2. On the basis of these, an example or the like of a device structure in a vertical power MOSFET of one embodiment of the present application will be explained.

First, an example of a specific layout of the top surface of a chip (normally, several millimeters square, and in this example, a silicon-based semiconductor substrate) will be explained. As shown in FIG. 1, in a power MOSFET element chip 2 forming elements over a square or rectangular plate-shaped silicon-based semiconductor substrate, a metal source electrode 5 (for example, aluminum-based electrode) located in the central part occupies the main area. Under the metal source electrode 5, a cell area 4 is provided.

Furthermore, around the cell area 4, an aluminum-based metal guard ring 3 is provided, and between the aluminum-based metal guard ring 3 and the metal source electrode 5, a metal gate electrode 7 and a metal gate wire 7w for leading out a polysilicon gate electrode to the outside are provided. In addition, in this example, the outermost part of the metal source electrode 5 forms a metal field plate 62 at the source potential. Moreover, a top surface 1a of the semiconductor chip 2 excluding a gate pad opening 8, a source pad opening 22, and the chip peripheral part (scribe area) is coated with a final passivation film 23.

Next, a planar position relationship will be explained by showing an enlarged plan view of the cell part cutout area R1 of FIG. 1 in FIG. 2. As shown in FIG. 2, in the cell area 4 (FIG. 1), when viewed in a planar manner, a column-shaped N-type drift area 11n (substrate epitaxy column area or N column area) and a column-shaped P-type drift area 11p (embedded epitaxy column area or P column area) are alternately laid repeatedly substantially over the entire surface. Substantially in the central part of each column-shaped N-type drift area 11n, a polysilicon gate electrode 15 (gate electrode or polysilicon film) is provided and between the polysilicon gate electrode 15 and the column-shaped P-type drift area 11p, an N+-type source area 26 (source area) is provided. In the entire area of each column-shaped P-type drift area 11p and in the area extending to under the polysilicon gate electrode 15 beyond the boundaries on both sides thereof, a P-type body area 6 is provided. Furthermore, in the central part of each column-shaped P-type drift area 11p, a contact groove 39 and a P+-type body contact area 14 are provided.

Next, an X-X' section in FIG. 1 and FIG. 2 is shown in FIG. 3. As shown in FIG. 3, on a back side 1b of the semiconductor substrate 2 (for example, silicon substrate), for example, aback side metal drain electrode 24 (metal drain electrode) is formed over substantially the entire surface. On the back side within the semiconductor substrate 2, for example, an N-type high-concentration substrate part is (N+-type drain area 12) is formed. On the side of the surface 1a of the N-type high-concentration substrate part 1s, for example, an epitaxial layer (drift area 11) having a thickness T of about 50 micrometers is formed. In the cell area 4, the drift area 11 configures a super junction structure 9 by the column-shaped N-type drift area 11n (substrate epitaxy column area or N column area) and the column-shaped P-type drift area 11p (embedded epitaxy column area or P column area), arranged alternately.

Each N column area 11n includes, in order from the bottom, for example, a lower substrate epitaxy column area 11nb, an intermediate substrate epitaxy column area 11nc, an upper substrate epitaxy column area 11nf, and the like. A thickness T1 of the lower substrate epitaxy column area 11nb is, for example, about 5 micrometers, a thickness T2 of the intermediate substrate epitaxy column area 11nc is, for example, about 20 micrometers, and a thickness T3 of the upper substrate epitaxy column area 11nf is, for example, about 25 micrometers.

Here, in this example, for example, the impurity concentration in the intermediate substrate epitaxy column area 11nc is set more than the impurity concentration in the lower substrate epitaxy column area, and the impurity concentration in the lower substrate epitaxy column area 11nb is set equal to or more than the impurity concentration in the upper substrate epitaxy column area 11nf. As a specific example (on the assumption that ion species is, for example, phosphorus), for example, the impurity concentration in the lower substrate epitaxy column area 11nb is about $3.3\times10^{15}/cm^3$, the impurity concentration in the intermediate substrate epitaxy column area 11nc is about $3.9\times10^{15}/cm^3$, and the impurity concentration in the upper substrate epitaxy column area 11nf is about $3.3\times10^{15}/cm^3$.

Such a relationship of the concentration and the multilayer area can be explained, for example, as follows. That is:

(1) in the high concentration area, it is necessary to fix the electric field strength peak in the area or in the vicinity thereof by securing a comparatively wide area in a position as deep as possible (to avoid interference with the device structure on the surface); and (2) when the concentration is set high up to the vicinity of the high concentration substrate on the back side, the charge balance cannot be maintained, resulting in a sudden reduction in breakdown voltage.

In the semiconductor area of the surface 1a (first main surface) of the semiconductor substrate 2 and on the surface of each P column area 11p, the P-type body area 6 is formed across the N column areas 11n on both sides. In contrast, over the surface 1a of the semiconductor substrate 2 and over each N column area 11n, for example, via a gate insulating film 20 such as a silicon oxide film, for example, the gate electrode 15 such as a polysilicon film is provided, and over the surface 1a of the semiconductor substrate 2, for example, there is provided an interlayer insulating film 19 including a silicon oxide-based insulating film or the like so as to cover the gate electrode 15 or the like.

In the interlayer insulating film 19 on the surface of the P-type body area 6 over each column area 11p, the contact groove 39 is provided across the inside of the semiconductor substrate 2 and inside thereof, for example, a tungsten plug 21 is embedded.

On the surface of the P-type body area 6 under the contact groove 39, the P+-type body contact area 14 is provided, and on the surface of the P-type body area 6 and between each gate electrode 15 and each contact groove 39, the N+-type source area (source area) 26 is provided.

Over the interlayer insulating film 19, for example, the aluminum-based metal source electrode 5 is provided so as to be coupled with each tungsten plug 21.

In this example, the angle formed by the boundary surface between the N column area 11n and the P column area 11p and the interface between the substrate part 1s and the drift area 11 (epitaxial layer), that is, a taper angle θ is, for example, about 89.2 degrees. Meanwhile, as the range of the particularly appropriate taper angle, for example, there can be illustrated 88.6 degrees to 89.6 degrees as an example. Furthermore, as the range of the practical taper angle, for example, there can be illustrated 90.0 degrees to 88.0 degrees as an example. This is the range corresponding to the vertical column and the minutely inclined column.

2. Explanation of an Example or the Like of a Manufacturing Process of the Vertical Power MOSFET of the One Embodiment of the Present Application (See FIG. 4 to FIG. 15 Mainly)

In this section, in correspondence to the device structure explained in the section 1, an example of essential parts of the manufacturing process will be explained. However, what is explained here is merely an example and it is needless to say that there can be various kinds of modifications.

In this example, there will be explained the process in which a trench is formed in the N-type epitaxial layer and the P column is embedded therein, but it is needless to say that the process may be reversed. Meanwhile, the use of the N-type epitaxial layer is more advantageous in terms of the heat treatment time for a boron-doped layer.

Figure 4:
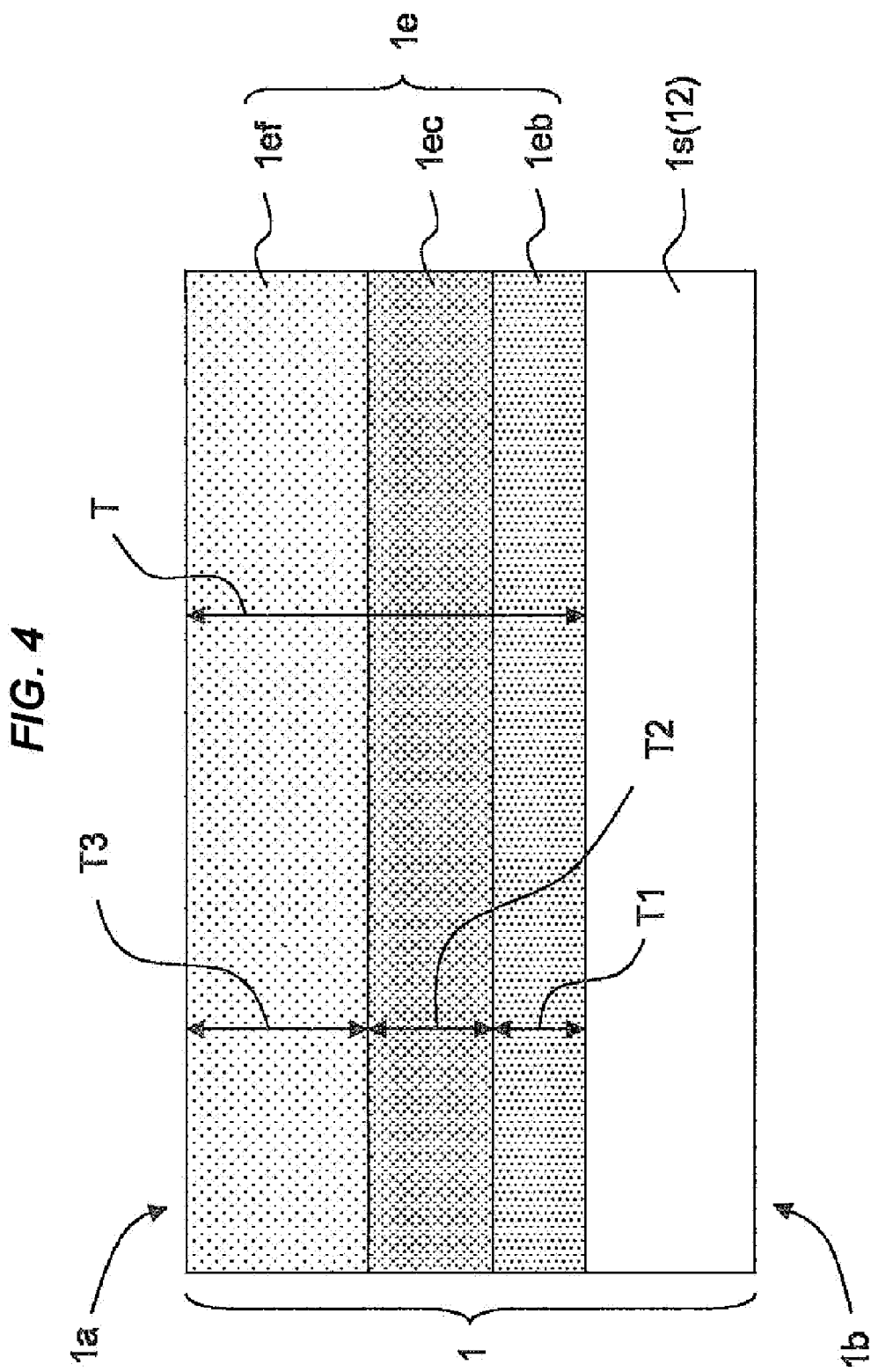
FIG. 4 is a wafer cross-sectional view during the manufacturing process of the portion corresponding to FIG. 3 (at the time of completion of substrate epitaxial growth process) for explaining an example or the like of the manufacturing process of the vertical power MOSFET of the one embodiment of the present application.
Figure 5:
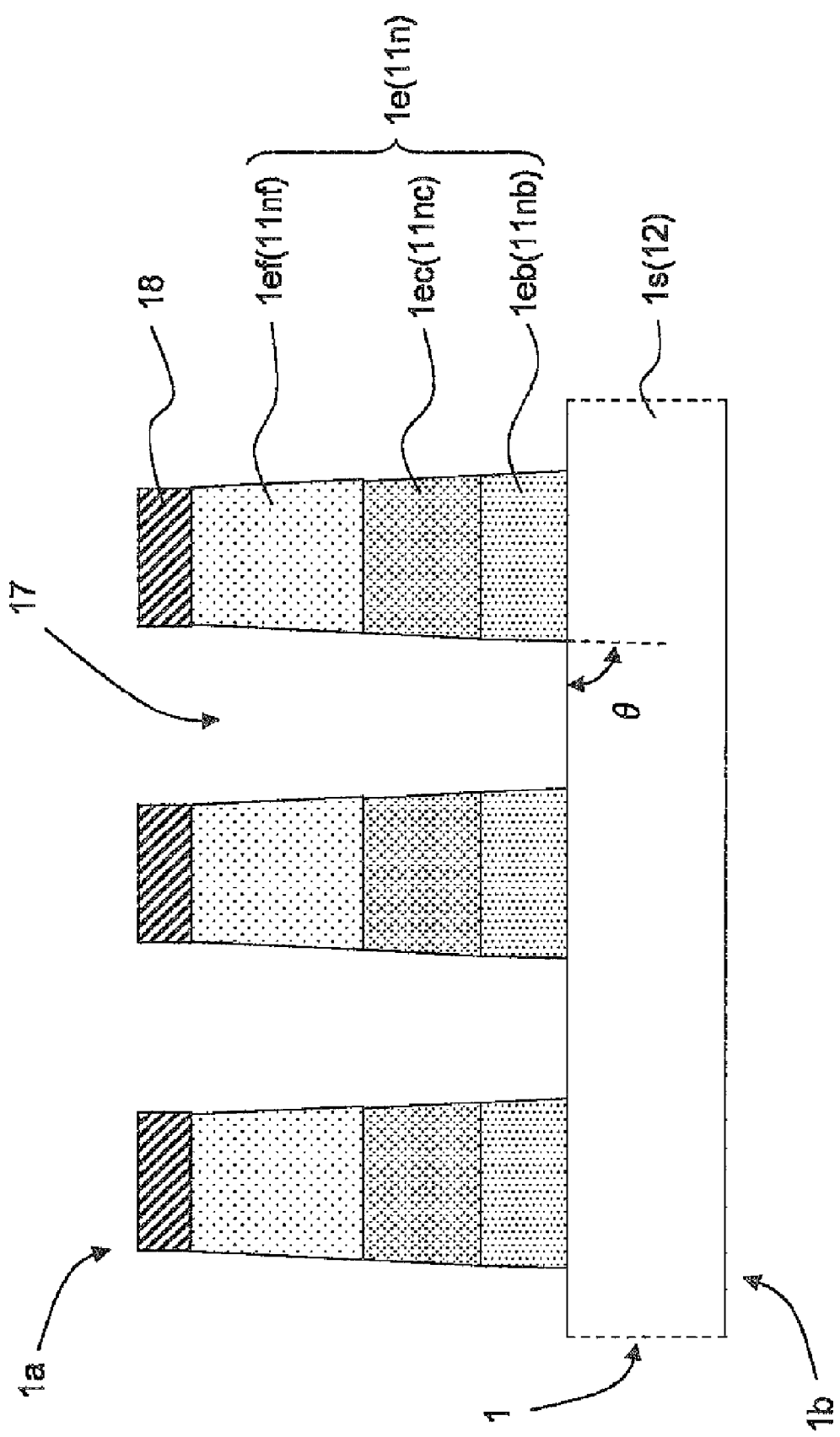
FIG. 5 is a wafer cross-sectional view during the manufacturing process of the portion corresponding to FIG. 3 (at the time of completion of trench-forming process) for explaining an example or the like of the manufacturing process of the vertical power MOSFET of the one embodiment of the present application.
Figure 6:
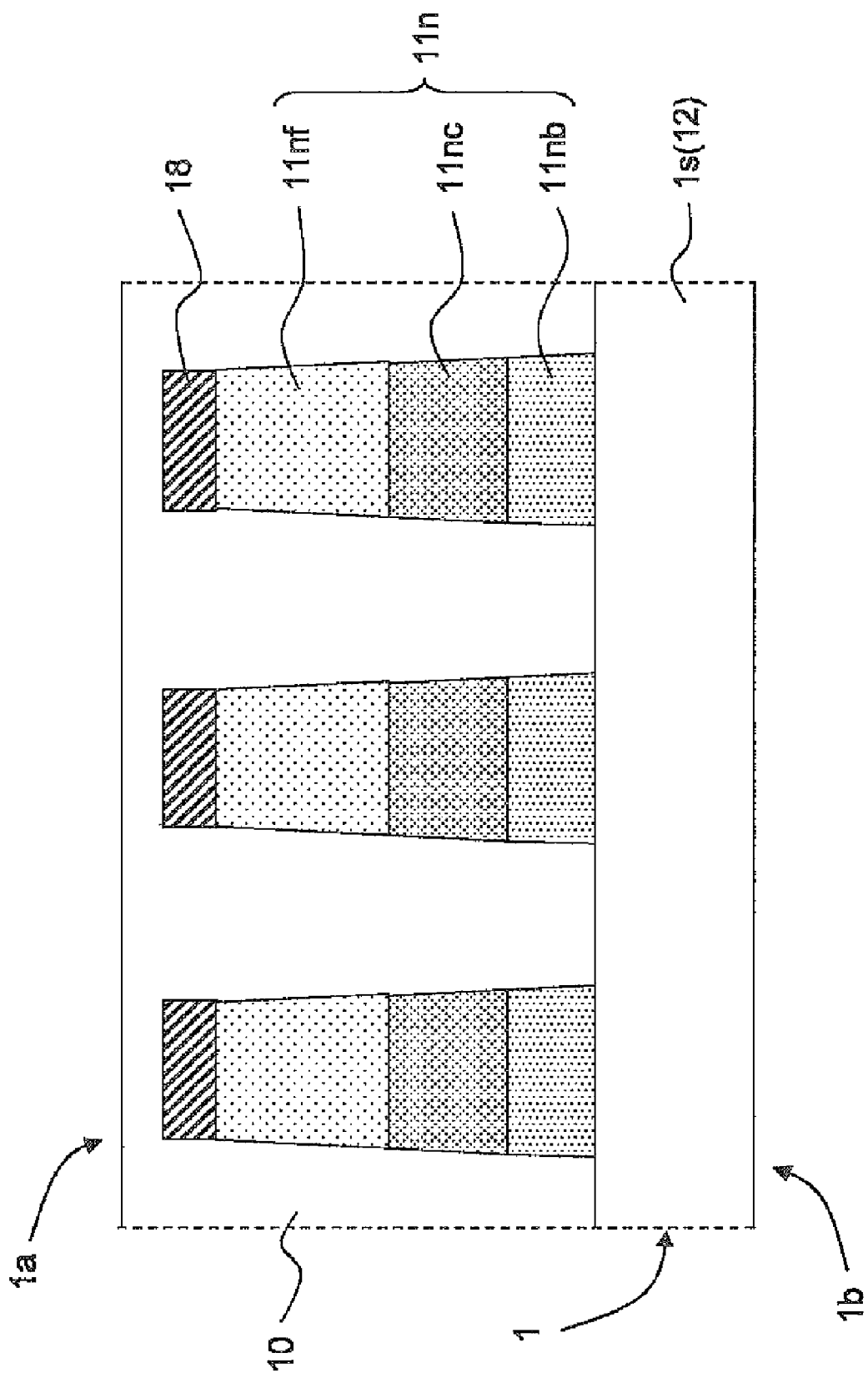
FIG. 6 is a wafer cross-sectional view during the manufacturing process of the portion corresponding to FIG. 3 (at the time of completion of embedded epitaxial growth process) for explaining an example or the like of the manufacturing process of the vertical power MOSFET of the one embodiment of the present application.
Figure 7:
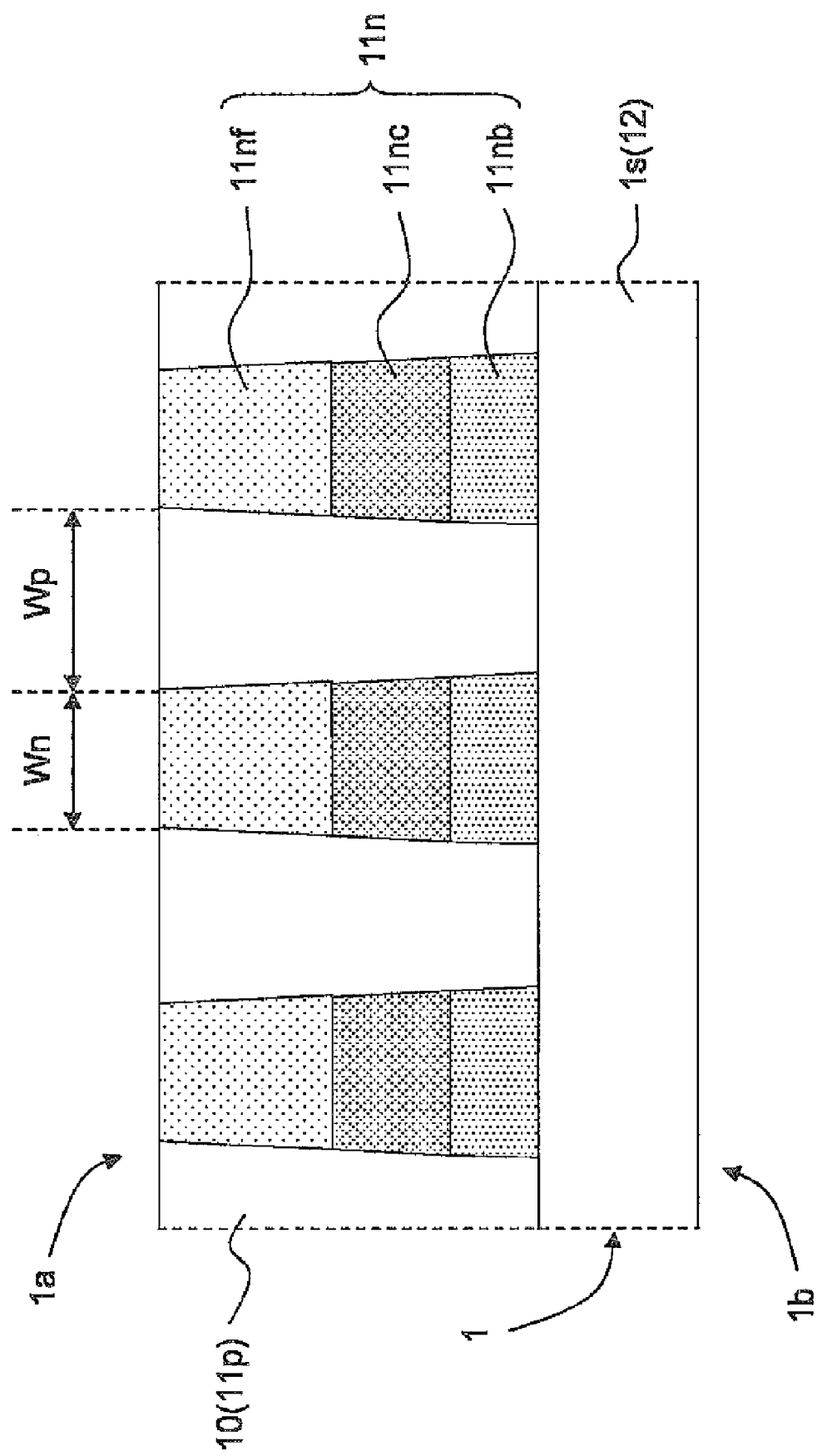
FIG. 7 is a wafer cross-sectional view during the manufacturing process of the portion corresponding to FIG. 3 (at the time of completion of planarization process) for explaining an example or the like of the manufacturing process of the vertical power MOSFET of the one embodiment of the present application.
Figure 8:
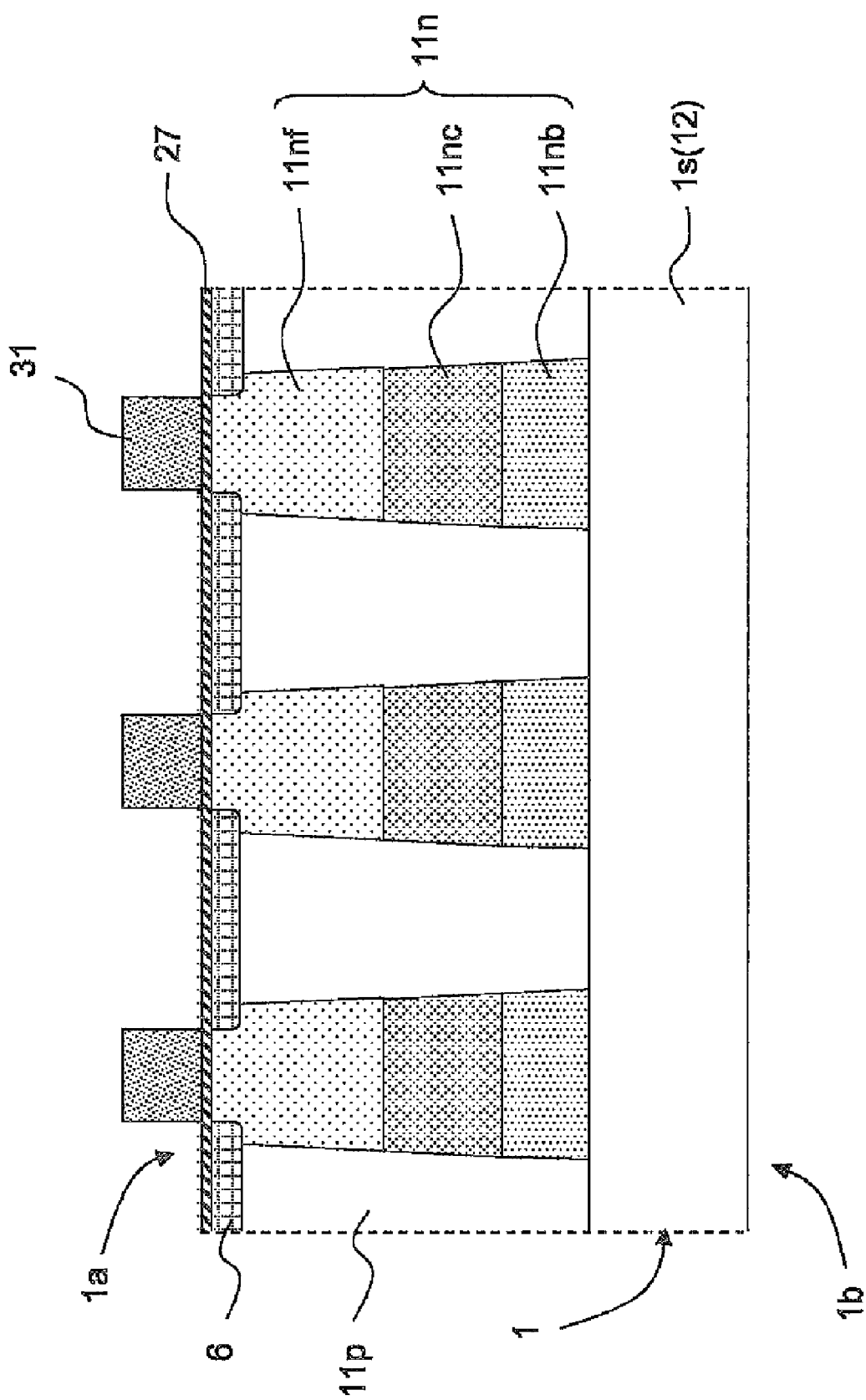
FIG. 8 is a wafer cross-sectional view during the manufacturing process of the portion corresponding to FIG. 3 (P-type body area introduction process) for explaining an example or the like of the manufacturing process of the vertical power MOSFET of the one embodiment of the present application.
Figure 9:
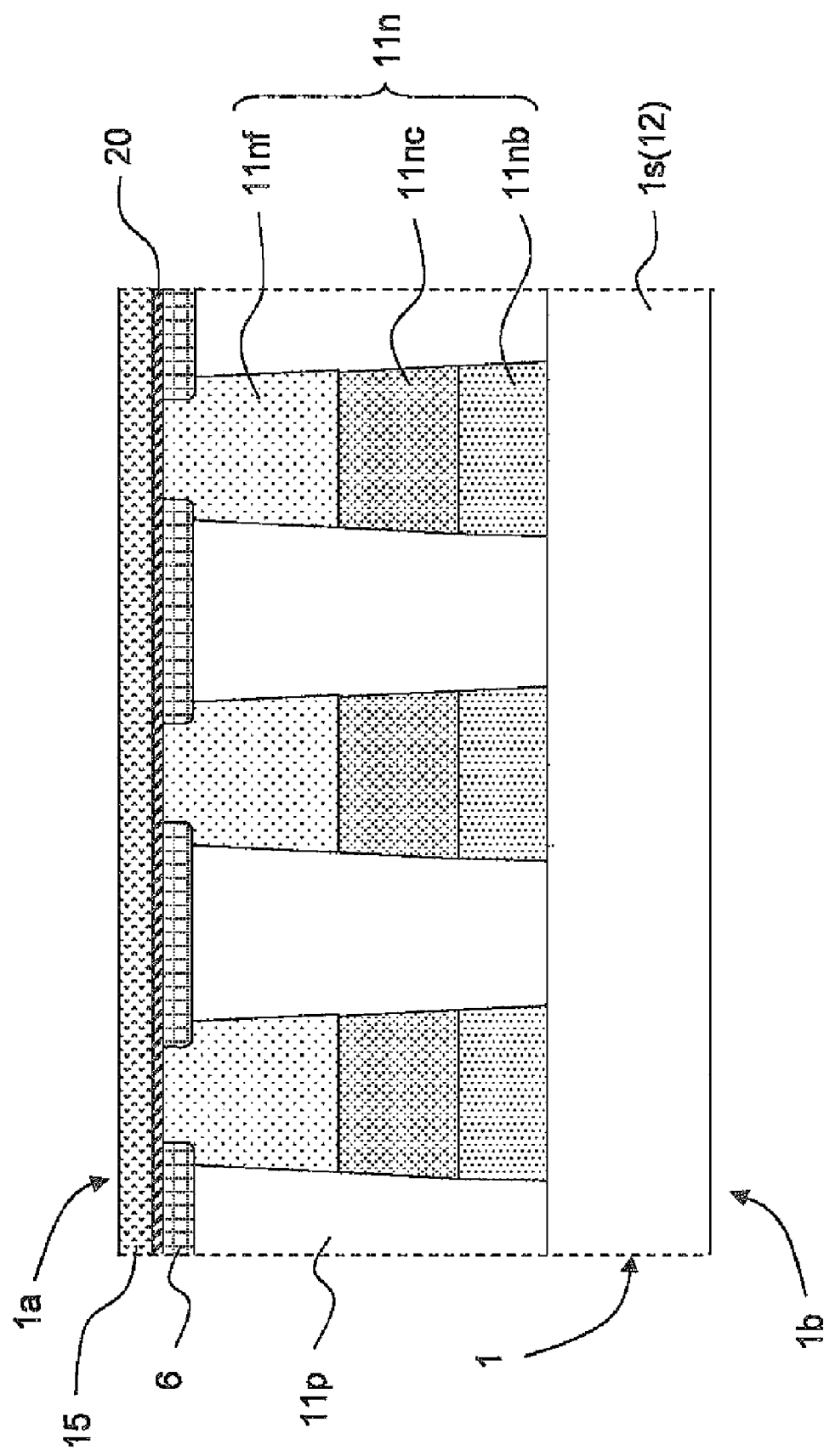
FIG. 9 is a wafer cross-sectional view during the manufacturing process of the portion corresponding to FIG. 3 (at the time of completion of gate insulating film and gate polysilicon film-forming process) for explaining an example or the like of the manufacturing process of the vertical power MOSFET of the one embodiment of the present application.
Figure 10:
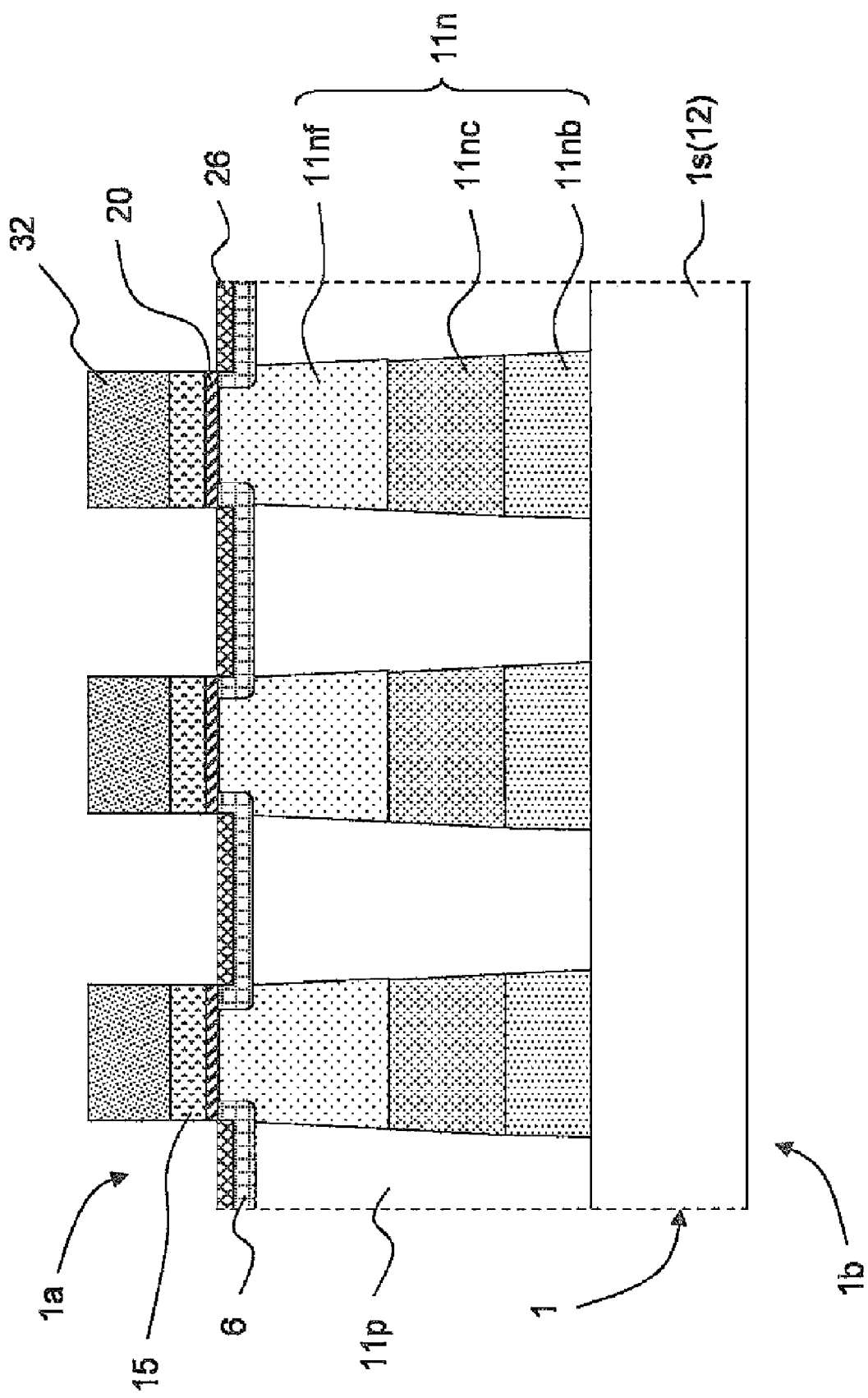
FIG. 10 is a wafer cross-sectional view during the manufacturing process of the portion corresponding to FIG. 3 (gate polysilicon film processing process) for explaining an example or the like of the manufacturing process of the vertical power MOSFET of the one embodiment of the present application.
Figure 11:
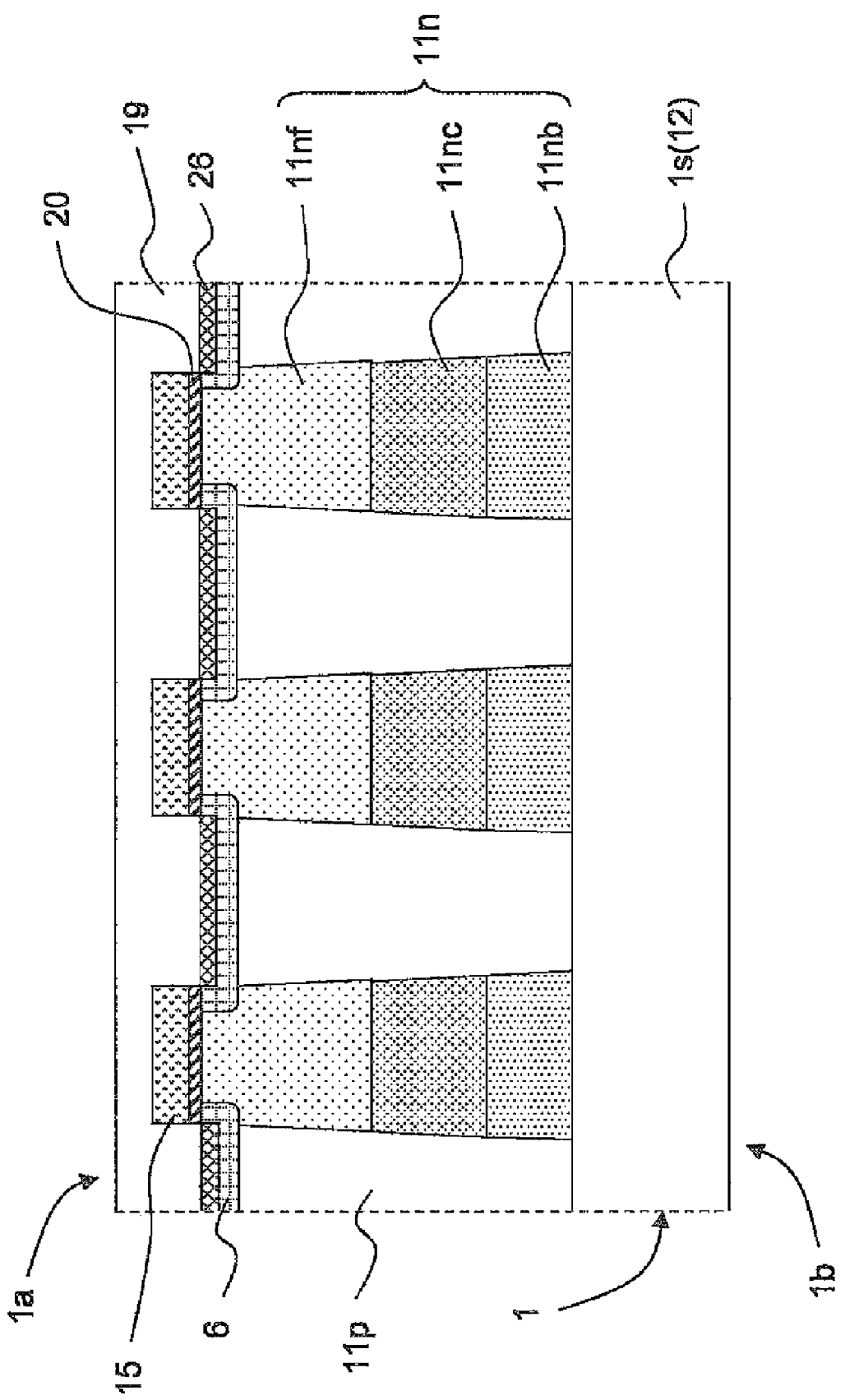
FIG. 11 is a wafer cross-sectional view during the manufacturing process of the portion corresponding to FIG. 3 (at the time of completion of interlayer insulating film-forming process) for explaining an example or the like of the manufacturing process of the vertical power MOSFET of the one embodiment of the present application.
Figure 12:
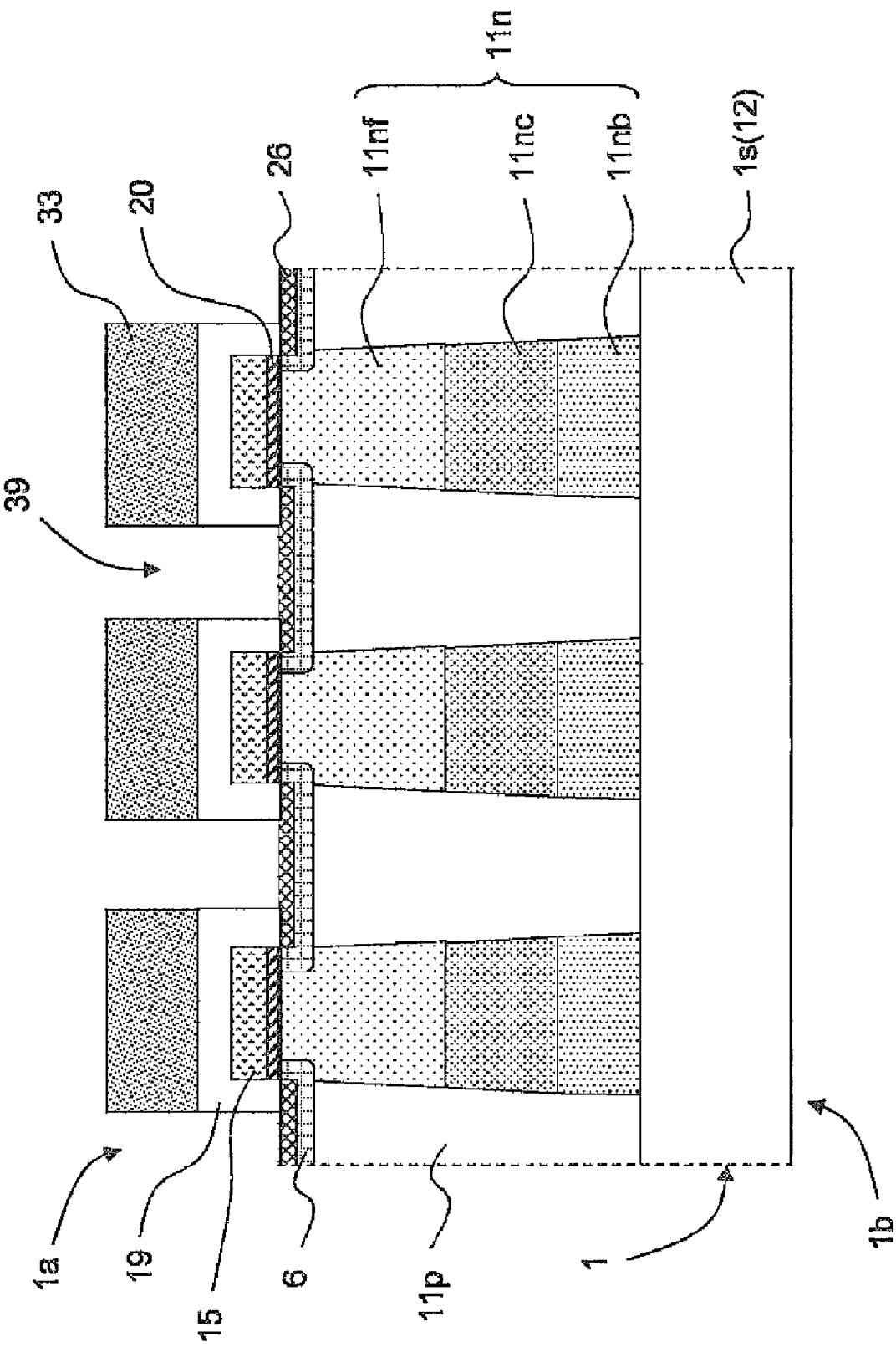
FIG. 12 is a wafer cross-sectional view during the manufacturing process of the portion corresponding to FIG. 3 (contact groove-forming process) for explaining an example or the like of the manufacturing process of the vertical power MOSFET of the one embodiment of the present application.
Figure 13:
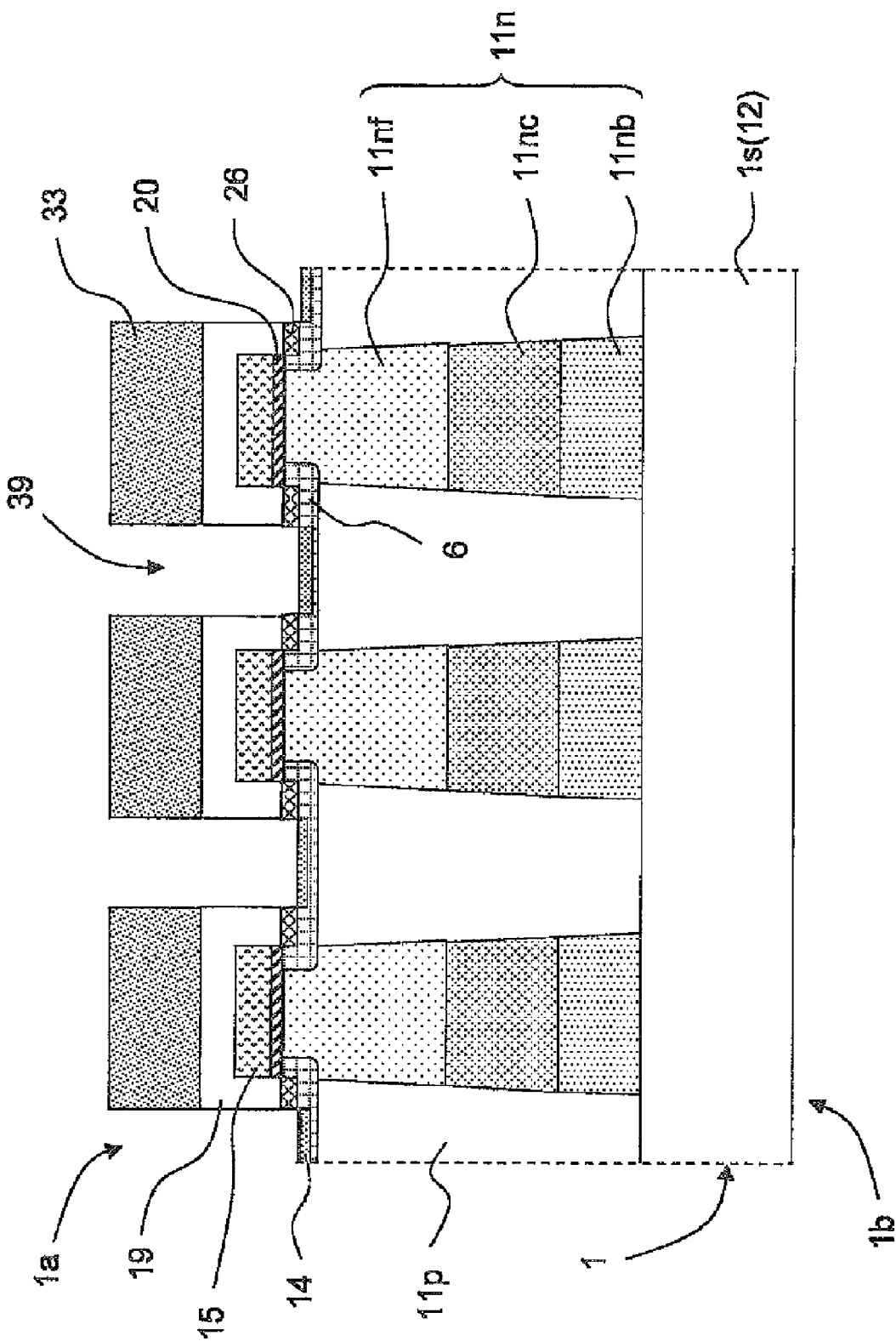
FIG. 13 is a wafer cross-sectional view during the manufacturing process of the portion corresponding to FIG. 3 (semiconductor substrate surface etching process) for explaining an example or the like of the manufacturing process of the vertical power MOSFET of the one embodiment of the present application.
Figure 14:
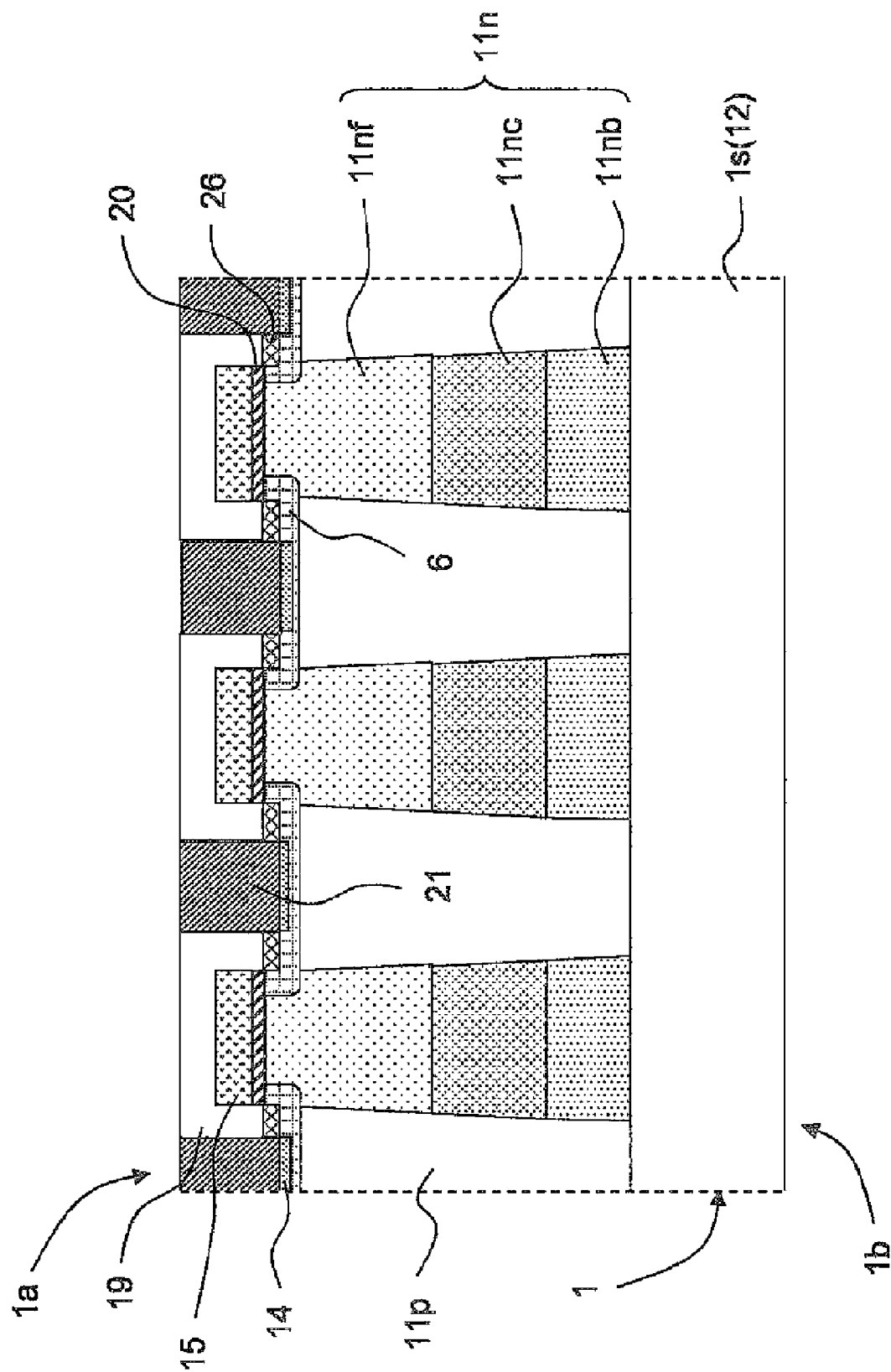
FIG. 14 is a wafer cross-sectional view during the manufacturing process of the portion corresponding to FIG. 3 (at the time of completion of tungsten plug embedding process) for explaining an example or the like of the manufacturing process of the vertical power MOSFET of the one embodiment of the present application.
Figure 15:
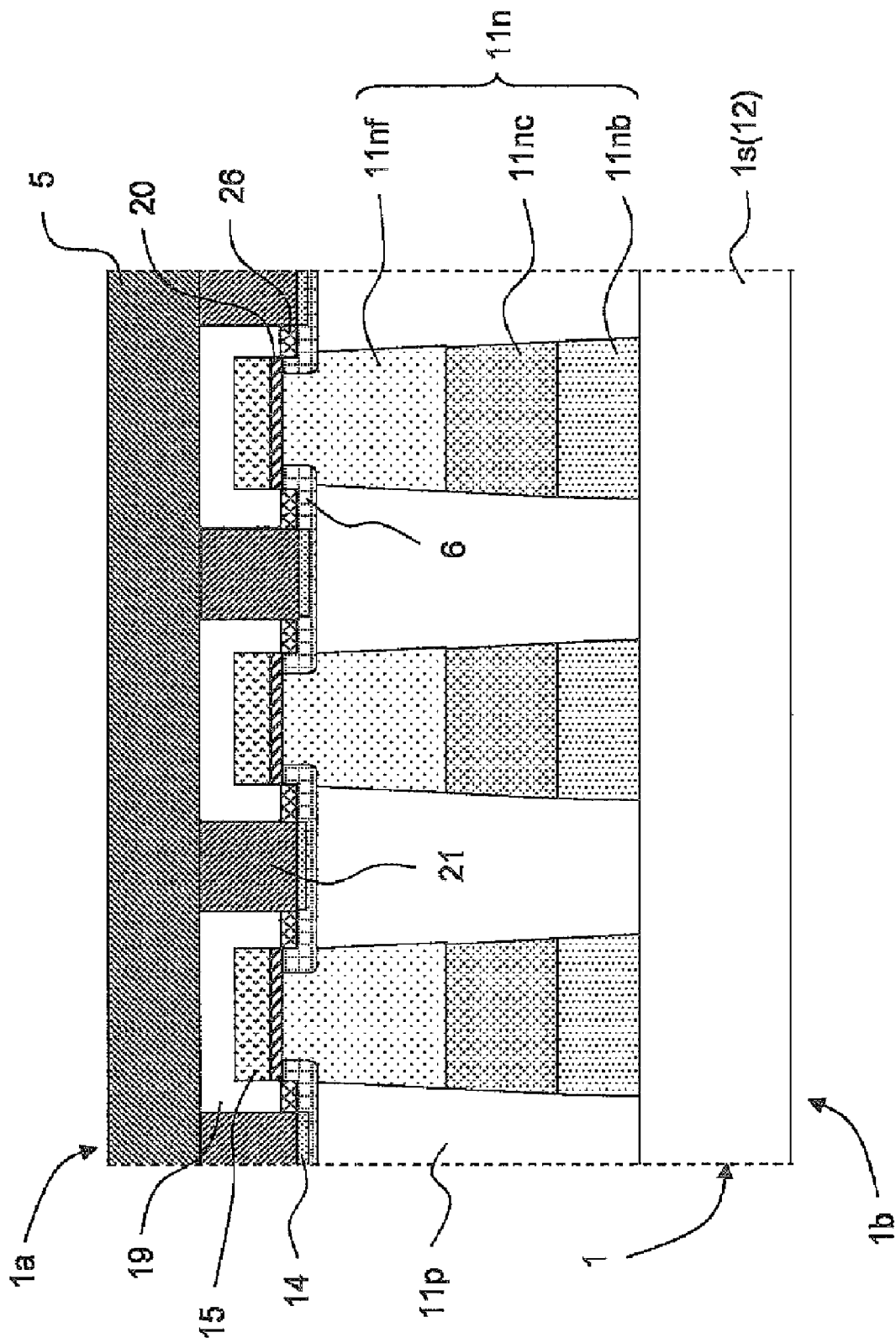
FIG. 15 is a wafer cross-sectional view during the manufacturing process of the portion corresponding to FIG. 3 (at the time of completion of aluminum film-forming process) for explaining an example or the like of the manufacturing process of the vertical power MOSFET of the one embodiment of the present application.

FIG. 4 is a wafer cross-sectional view during the manufacturing process of the portion corresponding to FIG. 3 (at the time of completion of substrate epitaxial growth process) for explaining an example or the like of the manufacturing process of the vertical power MOSFET of the one embodiment of the present application. FIG. 5 is a wafer cross-sectional view during the manufacturing process of the portion corresponding to FIG. 3 (at the time of completion of trench-forming process) for explaining an example or the like of the manufacturing process of the vertical power MOSFET of the one embodiment of the present application. FIG. 6 is a wafer cross-sectional view during the manufacturing process of the portion corresponding to FIG. 3 (at the time of completion of embedded epitaxial growth process) for explaining an example or the like of the manufacturing process of the vertical power MOSFET of the one embodiment of the present application. FIG. 7 is a wafer cross-sectional view during the manufacturing process of the portion corresponding to FIG. 3 (at the time of completion of planarization process) for explaining an example or the like of the manufacturing process of the vertical power MOSFET of the one embodiment of the present application. FIG. 8 is a wafer cross-sectional view during the manufacturing process of the portion corresponding to FIG. 3 (P-type body area introduction process) for explaining an example or the like of the manufacturing process of the vertical power MOSFET of the one embodiment of the present application. FIG. 9 is a wafer cross-sectional view during the manufacturing process of the portion corresponding to FIG. 3 (at the time of completion of gate insulating film and gate polysilicon film-forming process) for explaining an example or the like of the manufacturing process of the vertical power MOSFET of the one embodiment of the present application. FIG. 10 is a wafer cross-sectional view during the manufacturing process of the portion corresponding to FIG. 3 (gate polysilicon film processing process) for explaining an example or the like of the manufacturing process of the vertical power MOSFET of the one embodiment of the present application. FIG. 11 is a wafer cross-sectional view during the manufacturing process of the portion corresponding to FIG. 3 (at the time of completion of interlayer insulating film-forming process) for explaining an example or the like of the manufacturing process of the vertical power MOSFET of the one embodiment of the present application. FIG. 12 is a wafer cross-sectional view during the manufacturing process of the portion corresponding to FIG. 3 (contact groove-forming process) for explaining an example or the like of the manufacturing process of the vertical power MOSFET of the one embodiment of the present application. FIG. 13 is a wafer cross-sectional view during the manufacturing process of the portion corresponding to FIG. 3 (semiconductor substrate surface etching process) for explaining an example or the like of the manufacturing process of the vertical power MOSFET of the one embodiment of the present application. FIG. 14 is a wafer cross-sectional view during the manufacturing process of the portion corresponding to FIG. 3 (at the time of completion of tungsten plug embedding process) for explaining an example or the like of the manufacturing process of the vertical power MOSFET of the one embodiment of the present application. FIG. 15 is a wafer cross-sectional view during the manufacturing process of the portion corresponding to FIG. 3 (at the time of completion of aluminum film-forming process) for explaining an example or the like of the manufacturing process of the vertical power MOSFET of the one embodiment of the present application. On the basis of these, an example or the like of the manufacturing process of the vertical power MOSFET of the one embodiment of the present application is explained.

First, as shown in FIG. 4, there is prepared the N+ silicon single crystal substrate is (here, for example, 200ϕ wafer, but the wafer diameter may be 150ϕ, 300ϕ, or 450ϕ) doped with, for example, antimony (for example, about the order of $10^{18}$ to $10^{19}/cm^3$). This area is an area that should serve as the N+-type drain area 12.

Next, there is prepared a semiconductor wafer 1 in which over the N+ silicon single crystal substrate 1s, for example, a phosphorus-doped N epitaxial layer 1e (that is, substrate epitaxial growth layer) having a thickness T of about 50 micrometers is formed. The formation of the phosphorus-doped N epitaxial layer 1e is shown specifically as follows. First, on substantially the entire surface over the surface 1a (first main surface) of the N+ silicon single crystal substrate is (wafer), there is formed a bottom substrate epitaxial growth layer 1eb (the thickness T1 is, for example, about 5 micrometers). Next, on substantially the entire surface over the bottom substrate epitaxial growth layer 1eb, there is formed an intermediate substrate epitaxial growth layer 1ec (the thickness T2 is, for example, about 20 micrometers). Subsequently, over substantially the entire surface of the intermediate substrate epitaxial growth layer 1ec, there is formed a surface substrate epitaxial growth layer 1ef (the thickness T3 is, for example, about 25 micrometers).

Here, as the impurity concentration in the bottom substrate epitaxial growth layer 1eb, there can be included, for example, about $3.3 \times 10^{15}/cm^3$; as the impurity concentration in the intermediate substrate epitaxial growth layer 1ec, for example, about $3.9 \times 10^{15}/cm^3$; and as the impurity concentration in the surface substrate epitaxial growth layer 1ef, for example, $3.3 \times 10^{15}/cm^3$, respectively, as suitable concentrations.

Next, as shown in FIG. 5, over the device surface 1a (main surface opposite to the back side 1b) of the semiconductor wafer 1, there is formed, for example, a P-type column trench-forming hard mask film 18 (the thickness is, for example, about 1.5 micrometers) including P-TEOS (Plasma-Tetra-ethylorthosilicate) or the like.

Next, through the use of the P-type column trench forming hard mask film 18 as a mask, a P-type column trench 17 is formed by performing anisotropic dry etching (as the gas atmosphere, there can be illustrated as an example a mixed atmosphere of Ar, $SF_6$, $O_2$ or the like, and as the etching depth, there can be illustrated as an example about 50 micrometers) of the N epitaxial layer 1e or the like. As a specific example of trench etching, there can be illustrated as a suitable example the repetitive etching method such as the Bosch method in which deposition and etching elementary process are repeated. That is, the processing conditions of the deposition step are a gas flow rate (for example, $C_4F_8$) of, for example, about 300 to 800 sccm; a processing pressure of, for example, about 4 to 10 pascals; and a unit processing time of, for example, about 1 to 3 seconds. In contrast, the processing conditions of the etching step are a gas flow rate (for example, $SF_6$) of, for example, about 300 to 800 sccm; a processing pressure of, for example, about 2 to 8 pascals; and a unit elementary process processing time of, for example, about 0.5 to 2 seconds.

Due to this, the substrate epitaxial growth layer 1e serves as the column-shaped N-type drift area 11n (substrate epitaxy column area or N column area). Along with this, the bottom substrate epitaxial growth layer 1eb serves as the lower substrate epitaxy column area 11nb, the intermediate substrate epitaxial growth layer 1ec serves as the intermediate substrate epitaxy column area 11nc, and the surface substrate epitaxial growth layer 1ef serves as the upper substrate epitaxy column area 11nf.

Next, as shown in FIG. 6, by performing embedded epitaxial growth for the P-type column trench 17, there is formed a P-type embedded epitaxial layer 10 (as the boron concentration, for example, about $5 \times 10^{15}/cm^3$). Here, as the source gas of the embedded epitaxial growth, there can be illustrated as an example silicon tetrachloride, trichlorosilane, dichlorosilane, or monosilane. As a suitable range of the processing atmospheric pressure, about 10 kPa to 110 kPa can be illustrated as an example.

Next, as shown in FIG. 7, by the planarization process, for example, by CMP (Chemical Mechanical Polishing), the P-type embedded epitaxial layer 10 and the trench-forming hard mask film 18, outside the P-type column trench 23 are removed and also the surface 1a of the semiconductor wafer 1 is planarized. Here, a width Wn of the N-type column area 11n is, for example, about 6 micrometers and a width Wp of the P-type column area 11p is, for example, about 4 micrometers (that is, the pitch of the super junction is about 10 micrometers).

Next, as shown in FIG. 8, on substantially the entire surface of the surface 1a of the semiconductor wafer 1, there is formed a silicon oxide film 27 (sacrificial oxide film, and the thickness is, for example, about 100 nm) by, for example, thermal oxidation and a P-type body area-introducing resist film 31 is formed thereover by lithography. Next, the P-type body area 6 is introduced by ion implantation (dopant is boron) through the use of the P-type body area-introducing resist film 31 as a mask. This ion implantation is performed, for example, in the following two steps. As a first step, for example, implantation is performed in the order of 200 keV and $10^{12}/cm^2$, and subsequently, as a second step, for example, implantation is performed in the order of 75 keV and $10^{12}/cm^2$. After that, the P-type body area-introducing resist film 31 which has become unnecessary is removed from the entire surface by, for example, ashing or the like. Furthermore, the sacrificial oxide film 27 is removed, for example, from the entire surface by wet etching through the use of, for example, hydrofluoric acid-based etching liquid or the like.

Next, as shown in FIG. 9, on the surface 1a of the semiconductor wafer 1, the gate oxide film 20 (the film thickness is, for example, about 50 to 200 nm) is formed by thermal oxidation (for example, wet oxidation at 950 degrees Celsius). Note that, as wafer cleaning before gate oxidation, wet cleaning can be applied by using, for example, a first cleaning liquid of ammonium:hydrogen peroxide:pure water=1:1:5 (volume ratio) and a second cleaning liquid of hydrochloric acid:hydrogen peroxide:pure water=1:1:6 (volume ratio).

Next, over the gate oxide film 20, there is formed the gate polysilicon film 15 (the film thickness is, for example, about 200 to 800 nm) by, for example, low-pressure CVD (Chemical Vapor Deposition).

Next, as shown in FIG. 10, over the gate polysilicon film 15, for example, a gate electrode processing resist film 32 is coated and patterning is performed by, for example, the normal lithography. By using the patterned gate electrode processing resist film 32, the gate electrode 15 is patterned by, for example, anisotropic dry etching. As the gas atmosphere of the anisotropic dry etching, for example, there can be illustrates as a suitable example the $SF_6/O_2$-based gas atmosphere.

Next, the N+ source area 26 is introduced by ion implantation (for example, arsenic) through the use of the gate electrode processing resist film 32 as a mask (the dopant is, for example, arsenic, and there can be illustrated as examples, the order of about $10^{15}/cm^2$ as the dose amount, and about 40 keV as the implantation energy, respectively). After that, the gate electrode-processing resist film 32 which has become unnecessary is removed from the entire surface by, for example, ashing or the like.

Next, as shown in FIG. 11, on substantially the entire surface of the surface 1a of the semiconductor wafer 1, the PSG (Phospho-Silicate-Glass) film 19 (interlayer insulating film) is formed by CVD or the like (it may also be possible to overlap SOG films thereover and planarize them). As the interlayer insulating film 19, in addition to the PSG film, there can be applied BPSG, TEOS film, SiN film, others, or the composite film thereof. In addition, as the total film thickness of the interlayer insulating film 19, for example, about 900 nm can be illustrated as an example.

Next, as shown in FIG. 12, over the surface 1a of the semiconductor wafer 1, a contact groove-forming resist film 33 is formed and by using it as a mask, the contact groove 39 is opened by, for example, anisotropic dry etching. As the gas atmosphere of the anisotropic dry etching, for example, the $CHF_3/CF_4$-based gas atmosphere can be illustrated as a suitable example.

Next, as shown in FIG. 13, by using the contact groove-forming resist film 33 and the interlayer insulating film 19 as a mask, a recess area is formed by performing etching (for example, the depth is about 0.3 micrometers) on the substrate surface by anisotropic dry etching, and the contact groove 39 is extended into the substrate. As the gas atmosphere of the anisotropic dry etching, for example, the halogen-based gas atmosphere can be illustrated as a suitable example. Meanwhile, it is needless to say that the substrate etching or the like is not indispensable. Subsequently, by implanting ions into the recess area, the P+-type body contact area 14 is formed. As the ion implantation conditions, there can be illustrated the dopant of $BF_2$, the implantation energy of about 30 keV, and the dose amount of the order of about $10^{15}/cm^2$, respectively, as an example. After that, the contact groove-forming resist film 33 which has become unnecessary is removed from the entire surface by, for example, ashing or the like.

Next, as shown in FIG. 14, for example, by CVD (Chemical Vapor Deposition), sputtering film formation or the like, over the contact groove 39 and over substantially the entire surface over the surface 1a of the wafer 1, a tungsten film is formed. Next, by CMP or the like, the tungsten plug 21 is embedded into the contact groove 39 by planarization. Meanwhile, it may also be possible to directly form an aluminum-based metal film together with a barrier metal or the like instead of using the plug.

Next, as shown in FIG. 15, by forming the aluminum-based metal layer by sputtering or the like and patterning it, the metal source electrode 5 or the like is formed.

After this, as necessary, for example, there is formed, in the upper layer, a final passivation film such as an inorganic final passivation film and an organic inorganic final passivation film, and a pad opening and a gate opening are formed. As the final passivation film, in addition to the single layer film such as the inorganic final passivation film or the organic inorganic final passivation film, it may also be possible to stack the organic inorganic final passivation film or the like, over the inorganic final passivation film in the lower layer.

Furthermore, after that, as necessary, back grinding or the like is performed, and for example, by sputtering film formation, the back side metal drain electrode 24 (metal drain electrode) is formed on the back side 1b of the wafer 1 (see FIG. 3). After that, by dividing the wafer into the individual chips 2 by dicing or the like, a device as in FIG. 3 is obtained. After that, as necessary, packaging such as resin sealing may be performed.

3. Explanation of a Modification 1 (N Column Lateral Ion Implantation Structure) or the Like Relating to the Device Structure of the Vertical Power MOSFET of the One Embodiment of the Present Application (See Mainly FIG. 16)

The example explained in this section is a modification relating to the device structure explained in the section 1 and almost all the portions are the same as those explained in the section 1 and in the following, only different portions will be explained as a principle.

Figure 16:
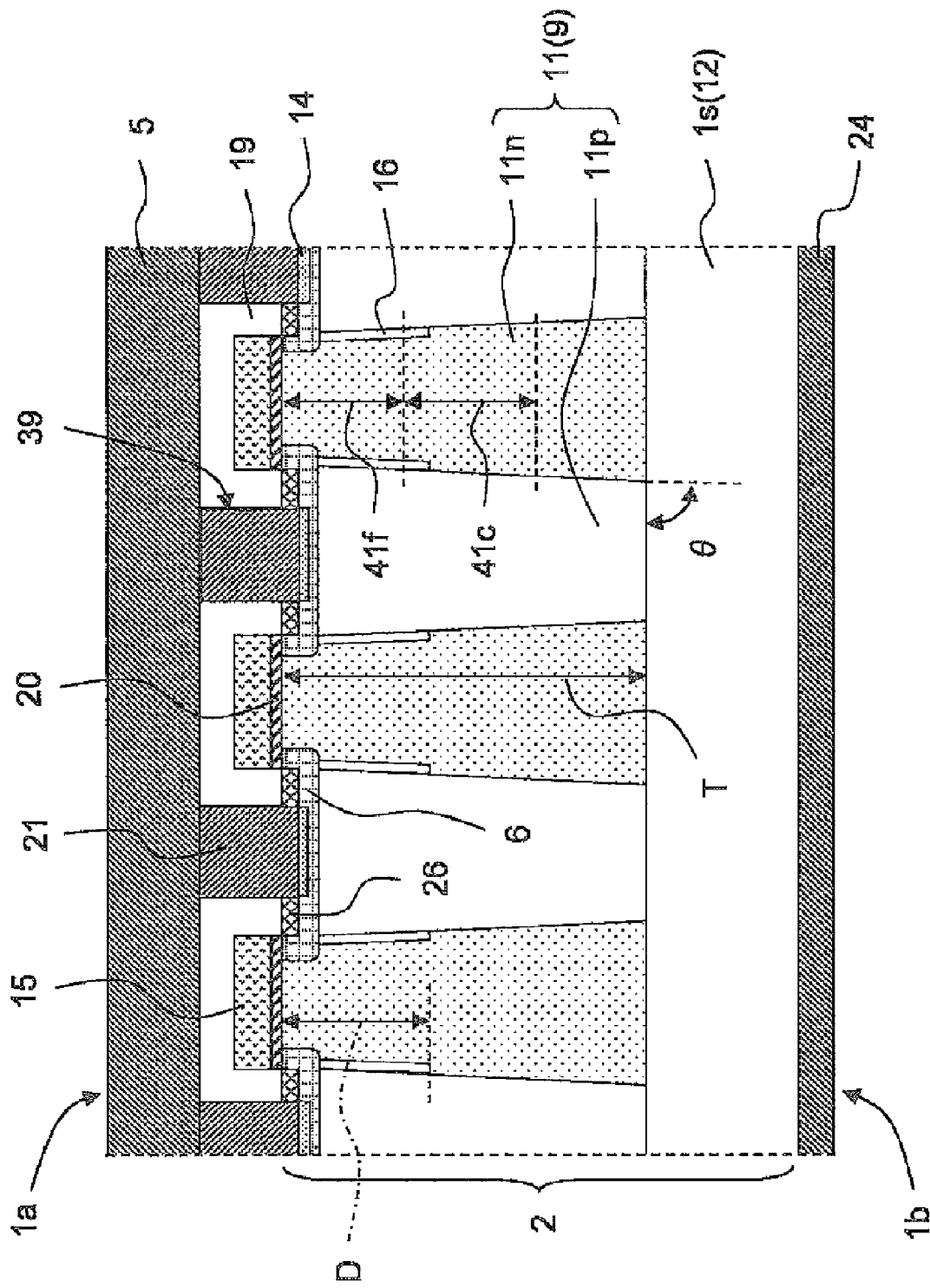
FIG. 16 is a device cross-sectional view corresponding to FIG. 3 for explaining a Modification 1 (N column lateral ion implantation structure) or the like relating to the device structure of the vertical power MOSFET of the one embodiment of the present application.

FIG. 16 is a device cross-sectional view corresponding to FIG. 3 for explaining a Modification 1 (N column lateral ion implantation structure) or the like relating to the device structure of the vertical power MOSFET of the one embodiment of the present application. On the basis of this, the Modification 1 (N column lateral ion implantation structure) or the like relating to the device structure of the vertical power MOSFET of the one embodiment of the present application will be explained.

As shown in FIG. 16, in this example, different from FIG. 3, the column-shaped N-type drift area 11n (substrate epitaxy column area or N column area) has substantially the single structure in the depth direction and instead, for example, a column side surface ion implantation area 16 is provided on the side surface part extending from an upper end part 41*f* to an intermediate portion 41*c* thereof. Here, as the relationship between a length D in the depth direction of the column side surface ion implantation area (length from the substrate surface to the lower end part) and the thickness T of the entire substrate epitaxial growth layer, for example, there can be illustrated a range in which the value of the length D in the depth direction of the column side surface ion implantation area/the thickness T of the entire substrate epitaxial growth layer is 1/4 to 3/4 as a suitable example.

4. Explanation of an Example or the Like of the Manufacturing Process of the Modification 1 (N Column Lateral Ion Implantation Structure) Relating to the Device Structure of the Vertical Power MOSFET of the One Embodiment of the Present Application (See Mainly FIG. 17 to FIG. 21)

The process explained in this section is the essential parts of the manufacturing process for the device structure explained in the section 3. Meanwhile, basically, the process is the same as that explained in FIG. 4 to FIG. 15 and in particular, the portions in FIG. 8 to FIG. 15 are substantially exactly the same in terms of process, and thus, in the following, only different portions are explained as a principle.

Figure 17:
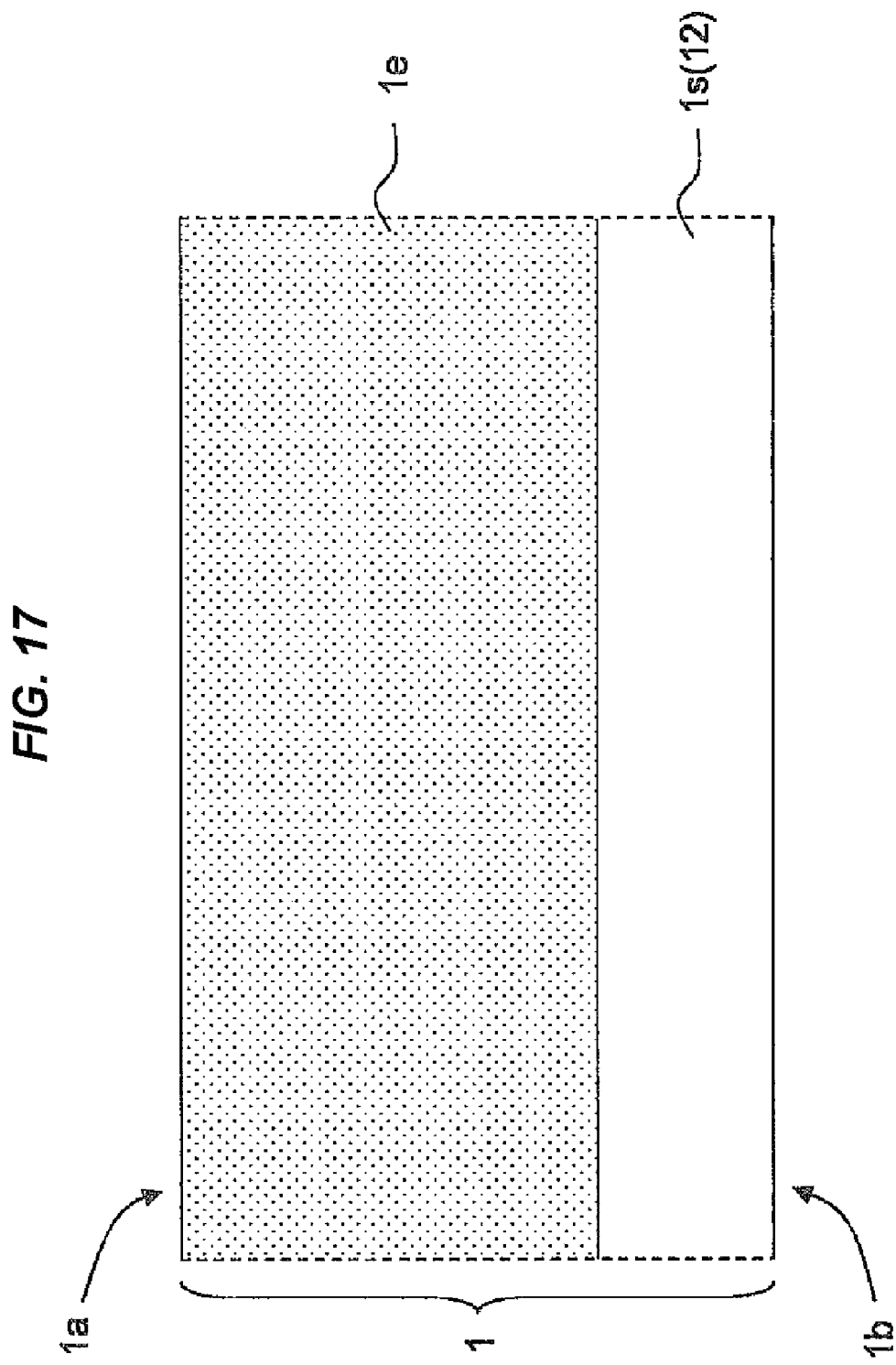
FIG. 17 is a wafer cross-sectional view during the manufacturing process of the portion corresponding to FIG. 16 (at the time of completion of substrate epitaxial growth process) for explaining an example or the like of the manufacturing process of the Modification 1 (N column lateral ion implantation structure) relating to the device structure of the vertical power MOSFET of the one embodiment of the present application.
Figure 18:
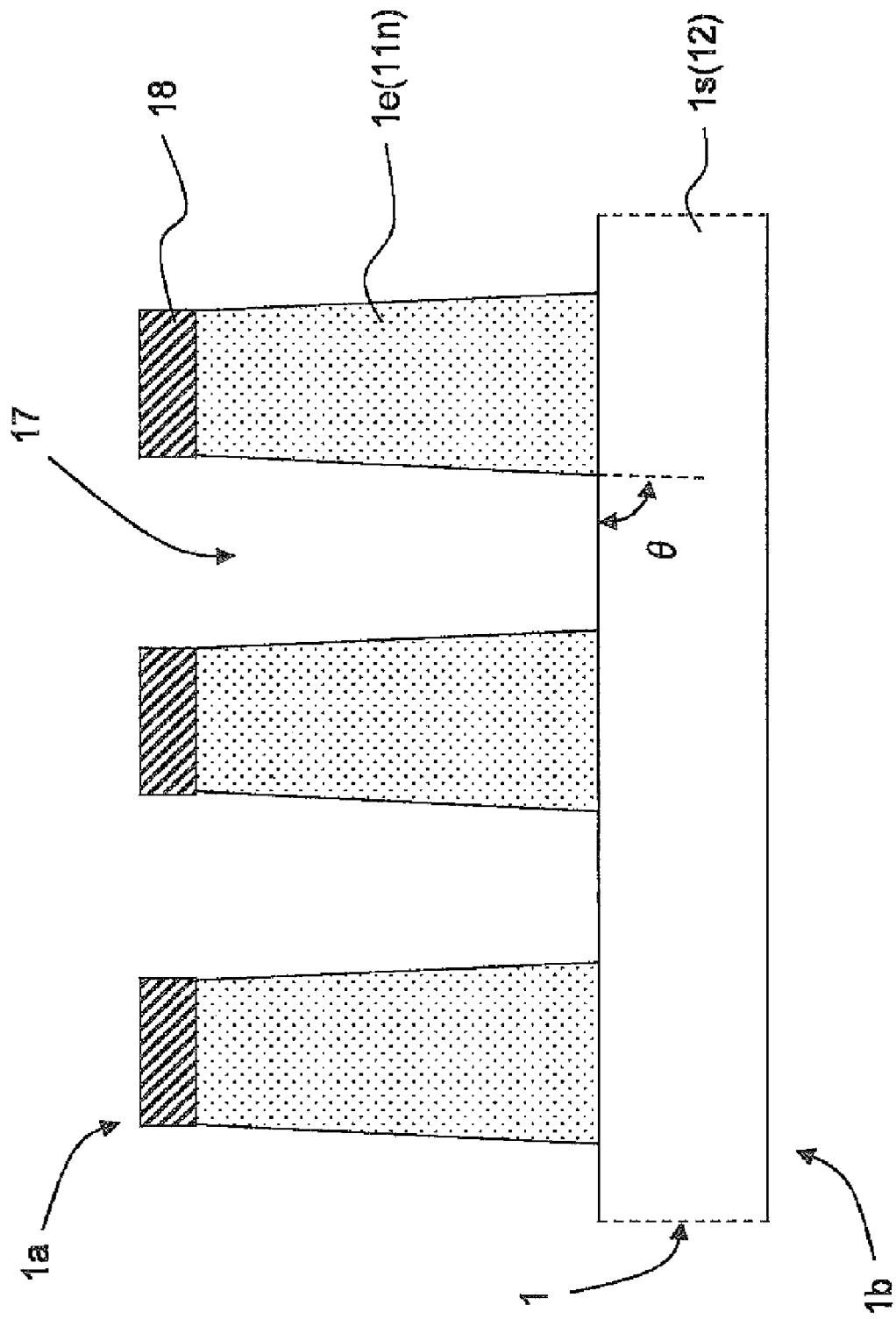
FIG. 18 is a wafer cross-sectional view during the manufacturing process of the portion corresponding to FIG. 16 (at the time of completion of trench-forming process) for explaining an example or the like of the manufacturing process of the Modification 1 (N column lateral ion implantation structure) relating to the device structure of the vertical power MOSFET of the one embodiment of the present application.
Figure 19:
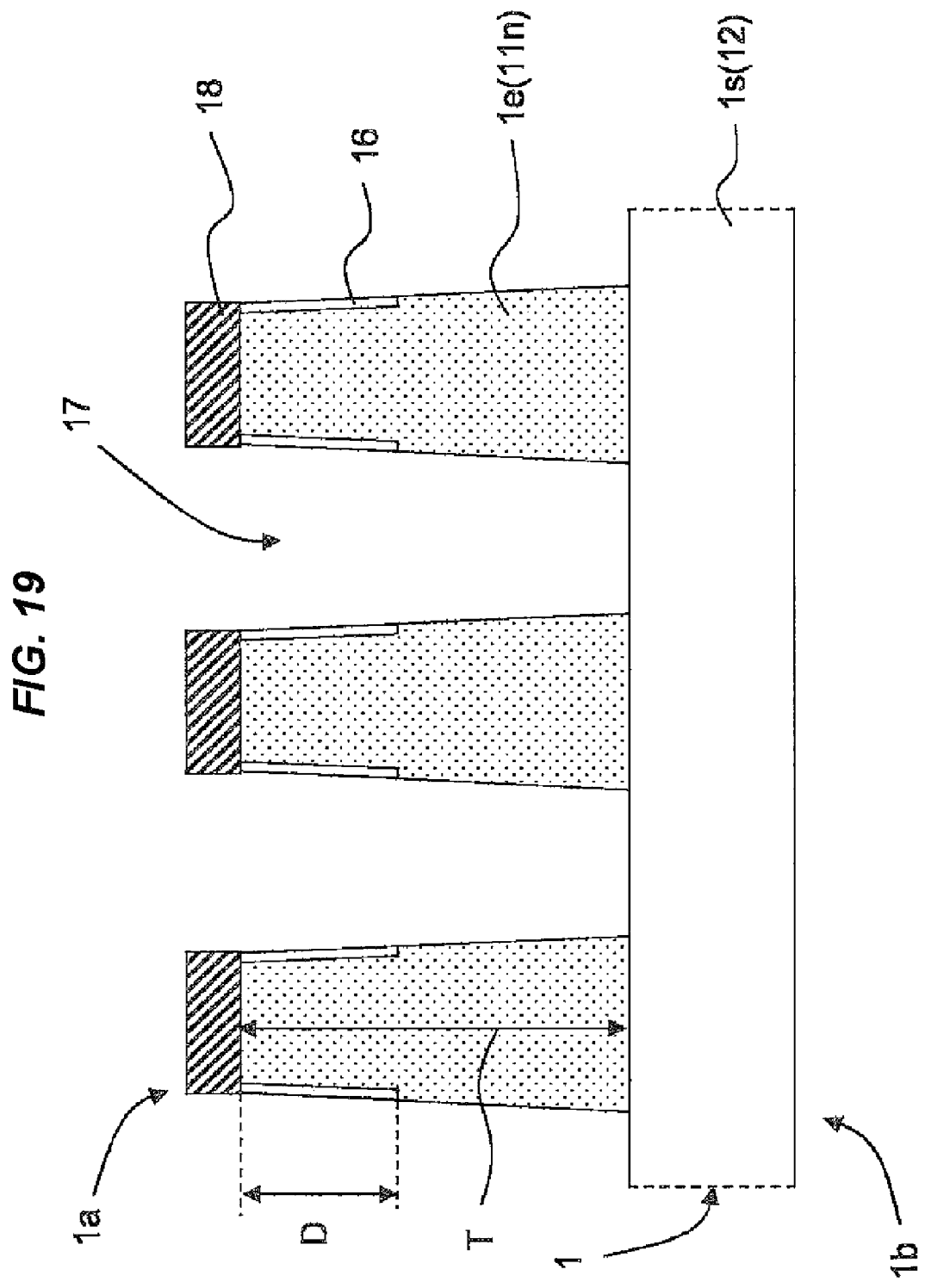
FIG. 19 is a wafer cross-sectional view during the manufacturing process of the portion corresponding to FIG. 16 (at the time of completion of column side surface ion implantation area introduction process) for explaining an example or the like of the manufacturing process of the Modification 1 (N column lateral ion implantation structure) relating to the device structure of the vertical power MOSFET of the one embodiment of the present application.
Figure 20:
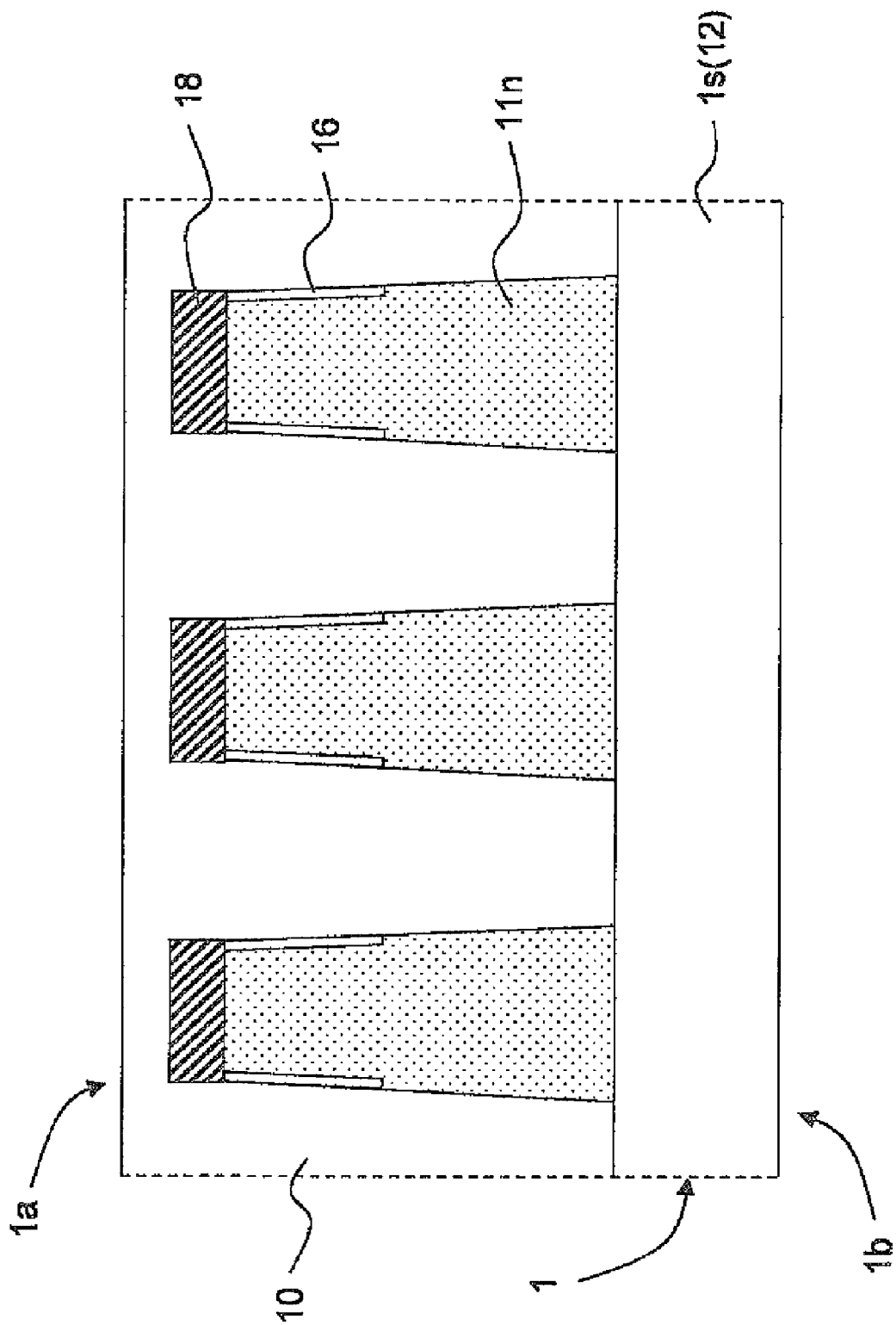
FIG. 20 is a wafer cross-sectional view during the manufacturing process of the portion corresponding to FIG. 16 (at the time of completion of embedded epitaxial growth process) for explaining an example or the like of the manufacturing process of the Modification 1 (N column lateral ion implantation structure) relating to the device structure of the vertical power MOSFET of the one embodiment of the present application.
Figure 21:
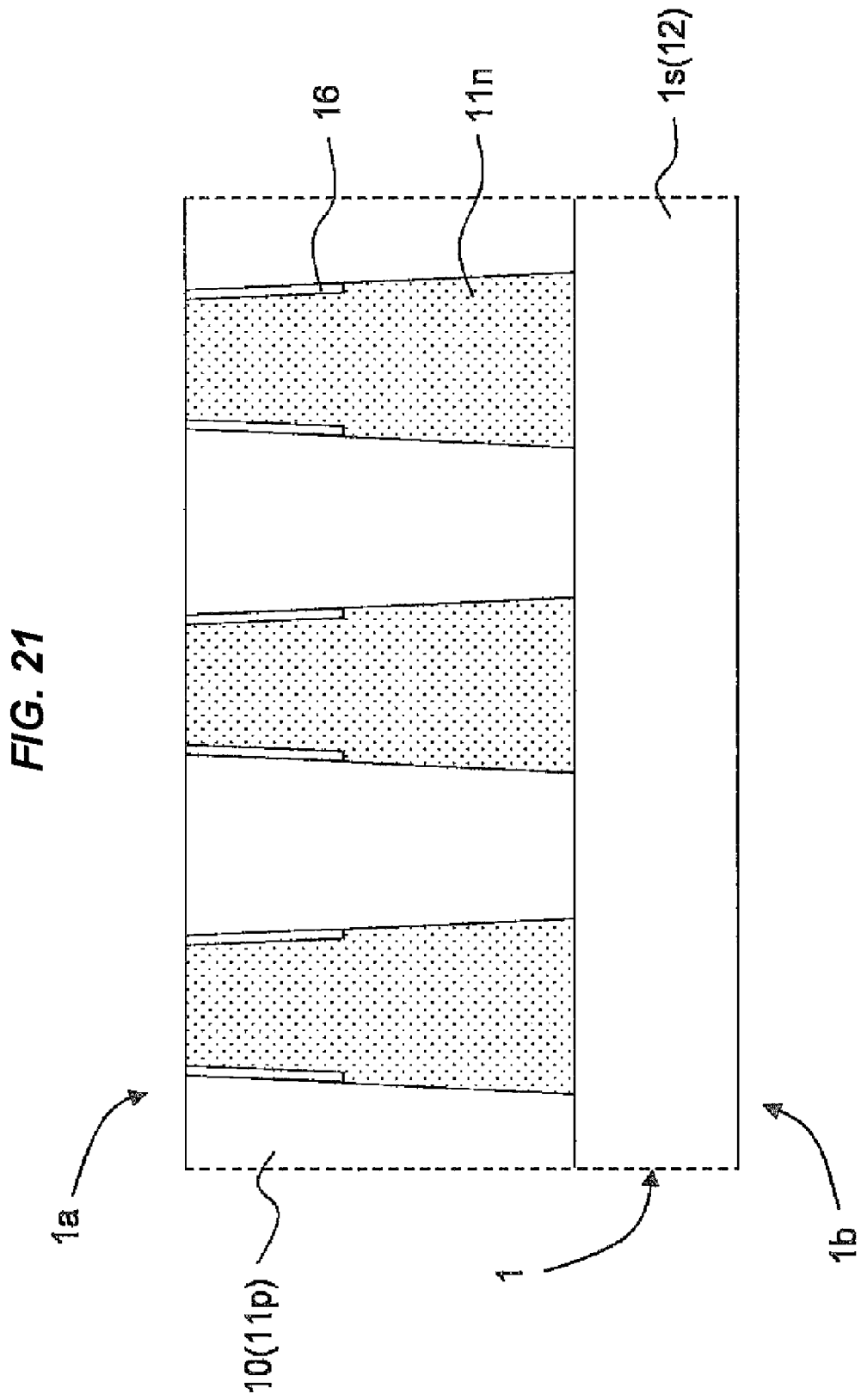
FIG. 21 is a wafer cross-sectional view during the manufacturing process of the portion corresponding to FIG. 16 (at the time of completion of planarization process) for explaining an example or the like of the manufacturing process of the Modification 1 (N column lateral ion implantation structure) relating to the device structure of the vertical power MOSFET of the one embodiment of the present application.

FIG. 17 is a wafer cross-sectional view during the manufacturing process of the portion corresponding to FIG. 16 (at the time of completion of substrate epitaxial growth process) for explaining an example or the like of the manufacturing process of the Modification 1 (N column lateral ion implantation structure) relating to the device structure of the vertical power MOSFET of the one embodiment of the present application. FIG. 18 is a wafer cross-sectional view during the manufacturing process of the portion corresponding to FIG. 16 (at the time of completion of trench-forming process) for explaining an example or the like of the manufacturing process of the Modification 1 (N column lateral ion implantation structure) relating to the device structure of the vertical power MOSFET of the one embodiment of the present application. FIG. 19 is a wafer cross-sectional view during the manufacturing process of the portion corresponding to FIG. 16 (at the time of completion of column side surface ion implantation area introduction process) for explaining an example or the like of the manufacturing process of the Modification 1 (N column lateral ion implantation structure) relating to the device structure of the vertical power MOSFET of the one embodiment of the present application. FIG. 20 is a wafer cross-sectional view during the manufacturing process of the portion corresponding to FIG. 16 (at the time of completion of embedded epitaxial growth process) for explaining an example or the like of the manufacturing process of the Modification 1 (N column lateral ion implantation structure) relating to the device structure of the vertical power MOSFET of the one embodiment of the present application. FIG. 21 is a wafer cross-sectional view during the manufacturing process of the portion corresponding to FIG. 16 (at the time of completion of planarization process) for explaining an example or the like of the manufacturing process of the Modification 1 (N column lateral ion implantation structure) relating to the device structure of the vertical power MOSFET of the one embodiment of the present application. On the basis of these, an example or the like of the manufacturing process of the Modification 1 (N column lateral ion implantation structure) relating to the device structure of the vertical power MOSFET of the one embodiment of the present application will be explained.

First, as shown in FIG. 17, there is prepared the N+ silicon single crystal substrate is (here, for example, 200φ wafer, but the wafer diameter may be 150φ, 300φ, or 450φ doped with, for example, antimony (for example, about the order of $10^{18}$ to $10^{19}/cm^3$). This area is an area that should serve as the N+-type drain area 12.

Next, there is prepared a semiconductor wafer 1 in which over the N+ silicon single crystal substrate 1*s*, for example, a phosphorus-doped N epitaxial layer 1*e* (that is, substrate epitaxial growth layer) having a thickness T of about 50 micrometers is formed. Here, as the impurity concentration in the phosphorus-doped N epitaxial layer 1*e*, there can be illustrated, for example, about $2\times10^{15}/cm^3$ as a suitable example.

Subsequently, as shown in FIG. 18, over the device surface 1*a* (main surface opposite to the back side 1*b*) of the semiconductor wafer 1, there is formed, for example, a P-type column trench-forming hard mask film 18 (the thickness is, for example, about 1.5 micrometers) including P-TEOS (Plasma-Tetraethylorthosilicate) or the like.

Next, through the use of the P-type column trench forming hard mask film 18 as a mask, a P-type column trench 17 is formed by performing anisotropic dry etching (as the gas atmosphere, there can be illustrated as an example a mixed atmosphere of Ar, $SF_6$, $O_2$ or the like, and as the etching depth, there can be illustrated as an example about 50 micrometers) of the N epitaxial layer 1*e* or the like. As a specific example of trench etching, there can be illustrated as a suitable example the repetitive etching method such as the Bosch method in which deposition and etching elementary process are repeated. That is, the processing conditions of the deposition step are a gas flow rate (for example, $C_4F_8$) of, for example, about 300 to 800 sccm; a processing pressure of, for example, about 4 to 10 pascals; and a unit processing time of, for example, about 1 to 3 seconds. In contrast, the processing conditions of the etching step are a gas flow rate (for example, $SF_6$) of, for example, about 300 to 800 sccm; a processing pressure of, for example, about 2 to 8 pascals; and a unit elementary process processing time of, for example, about 0.5 to 2 seconds.

Due to this, the substrate epitaxial growth layer 1*e* serves as the column-shaped N-type drift area 11*n* (substrate epitaxy column area or N column area).

Next, as shown in FIG. 19, for example, by performing inclined ion implantation of boron or the like from the device surface 1*a* side of the semiconductor wafer 1, the column side surface ion implantation area 16 is formed on the sidewall of the trench 17, that is, on the sidewall (surface) from the upper end part to the intermediate part of the column-shaped N-type drift area 11*n* (substrate epitaxial column area or N column area). As the conditions of the inclined ion implantation, for example, the following can be illustrated as a suitable example. That is, under the conditions of the ion species of, for example, boron, the inclination angle of, for example, about 5 to 10 degrees from vertical, the implantation energy of, for example, about 20 keV, and the dose amount of, for example, about $2\times10^{13}/cm^2$, implantation is performed 4 separate times with being rotated 45 degrees in the main surface of the wafer, each time.

Next, as shown in FIG. 20, by performing embedded epitaxial growth for the P-type column trench 17, there is formed a P-type embedded epitaxial layer 10 (as the boron concentration, for example, about $5\times10^{15}/cm^3$). Here, as the source gas of the embedded epitaxial growth, there can be illustrated as an example silicon tetrachloride, trichlorosilane, dichlorosilane, or monosilane. As a suitable range of the processing atmospheric pressure, about 10 kPa to 110 kPa can be illustrated as an example.

Next, as shown in FIG. 21, by the planarization process, for example, by CMP (Chemical Mechanical Polishing), the P-type embedded epitaxial layer 10 and the trench-forming hard mask film 18, outside the P-type column trench 23 are removed and also the surface 1a of the semiconductor wafer 1 is planarized. Here, a width Wn of the N-type column area 11n is, for example, about 6 micrometers and a width Wp of the P-type column area 11p is, for example, about 4 micrometers (that is, the pitch of the super junction is about 10 micrometers).

After this, the processes in FIG. 8 to FIG. 15 are performed.

5. Explanation of a Modification 2 (Multilayer N Epitaxy Layer and N Column Lateral Ion Implantation Structure) or the Like Relating to the Device Structure of the Vertical Power MOSFET of the One Embodiment of the Present Application (See Mainly FIG. 22)

The example explained in this section is a modification relating to the device structure explained in the section 1 and almost all the portions are the same as those explained in the section 1 and in the following, only the different portions will be explained as a principle.

Figure 22:
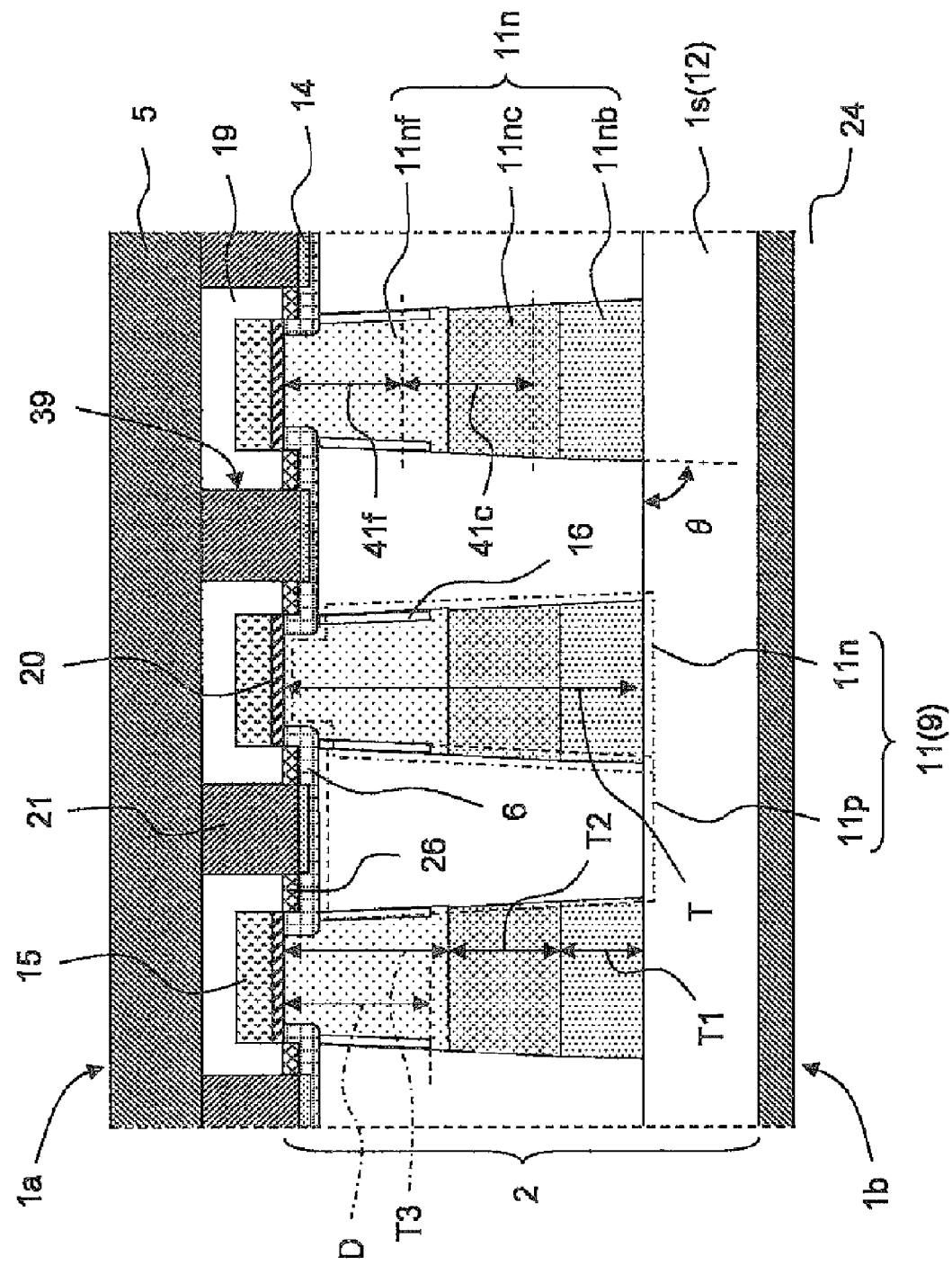
FIG. 22 is a device cross-sectional view corresponding to FIG. 3 for explaining a Modification 2 (multilayer N epitaxy layer and N column lateral ion implantation structure) or the like relating to the device structure of the vertical power MOSFET of the one embodiment of the present application.

FIG. 22 is a device cross-sectional view corresponding to FIG. 3 for explaining a Modification 2 (multilayer N epitaxy layer and N column lateral ion implantation structure) or the like relating to the device structure of the vertical power MOSFET of the one embodiment of the present application. On the basis of this, the Modification 2 (multilayer N epitaxy layer and N column lateral ion implantation structure) or the like relating to the device structure of the vertical power MOSFET of the one embodiment of the present application is explained.

As shown in FIG. 22, this example is a structure obtained by combining the example in FIG. 3 and the example in FIG. 16, that is, by combining the multilayer N epitaxy layer structure in FIG. 3 and the N column lateral ion implantation structure in FIG. 16. That is, the column side surface ion implantation area 16 is provided additionally on at least a part of the side surface from the upper end part 41f to the intermediate part 41c of the column-shaped N-type drift area 11n (substrate epitaxy column area or N column area) in FIG. 3.

6. Explanation of an Example or the Like of the Manufacturing Process of the Modification 2 (Multilayer N Epitaxy Layer and N Column Lateral Ion Implantation Structure) Relating to the Device Structure of the Vertical Power MOSFET of the One Embodiment of the Present Application (See Mainly FIG. 23)

The process explained in this section is the essential parts of the manufacturing process for the device structure explained in the section 5. Meanwhile, basically, the process is the same as that explained in FIG. 4 to FIG. 15 and in particular, the portions in FIG. 4, FIG. 5, FIG. 6 to FIG. 15, and FIG. 19 to FIG. 21 are substantially the same in terms of process, and thus, in the following, only different portions will be explained as a principle.

Figure 23:
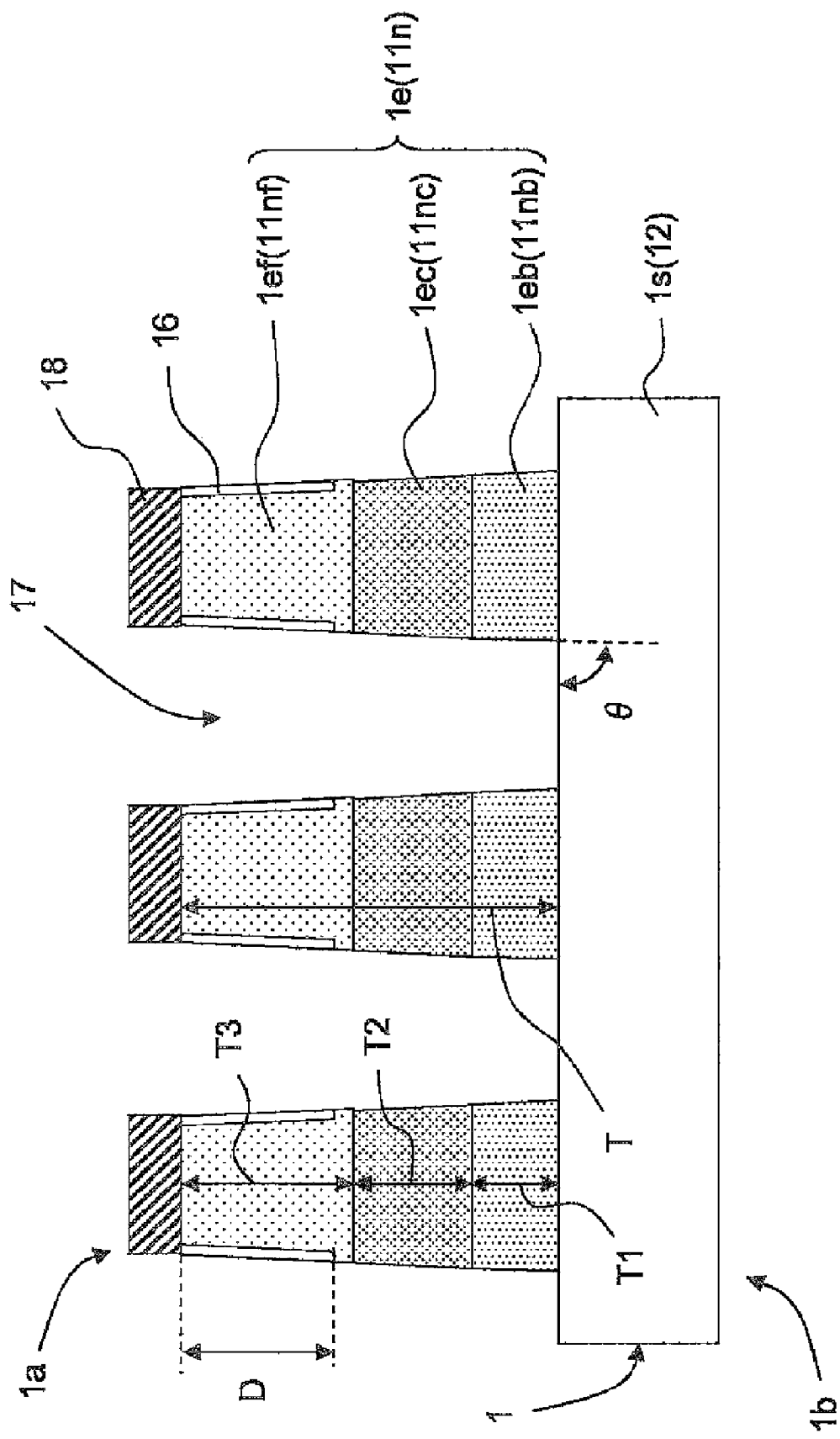
FIG. 23 is a wafer cross-sectional view during the manufacturing process of the portion corresponding to FIG. 22 (at the time of completion of column side surface ion implantation area introduction process) for explaining an example or the like of the manufacturing process of the Modification 2 (multilayer N epitaxy layer and N column lateral ion implantation structure) relating to the device structure of the vertical power MOSFET of the one embodiment of the present application.

FIG. 23 is a wafer cross-sectional view during the manufacturing process of the portion corresponding to FIG. 22 (at the time of completion of column side surface ion implantation area introduction process) for explaining an example or the like of the manufacturing process of the Modification 2 (multilayer N epitaxy layer and N column lateral ion implantation structure) relating to the device structure of the vertical power MOSFET of the one embodiment of the present application. On the basis of this, an example or the like of the manufacturing process of the Modification (multilayer N epitaxy layer and N column lateral ion implantation structure) relating to the device structure of the vertical power MOSFET of the one embodiment of the present application will be explained.

By performing inclined ion implantation of, for example, boron or the like for the wafer 1 having been subjected to the processing in FIG. 4 and FIG. 5 from the device surface 1a side of the semiconductor wafer 1 as shown in FIG. 23 (see FIG. 22), the column side surface ion implantation area 16 is formed on the sidewall of the trench 17, that is, on the sidewall (surface) from the upper end part to the intermediate part of the column-shaped N-type drift area 11n (substrate epitaxy column area or N column area).

After that, the processes in FIG. 6 to FIG. 15 are performed.

7. Complementary Explanation Relating to the Embodiment (Including the Modifications) and Consideration of the Whole (See FIG. 24 to FIG. 29 Mainly)

Figure 24:
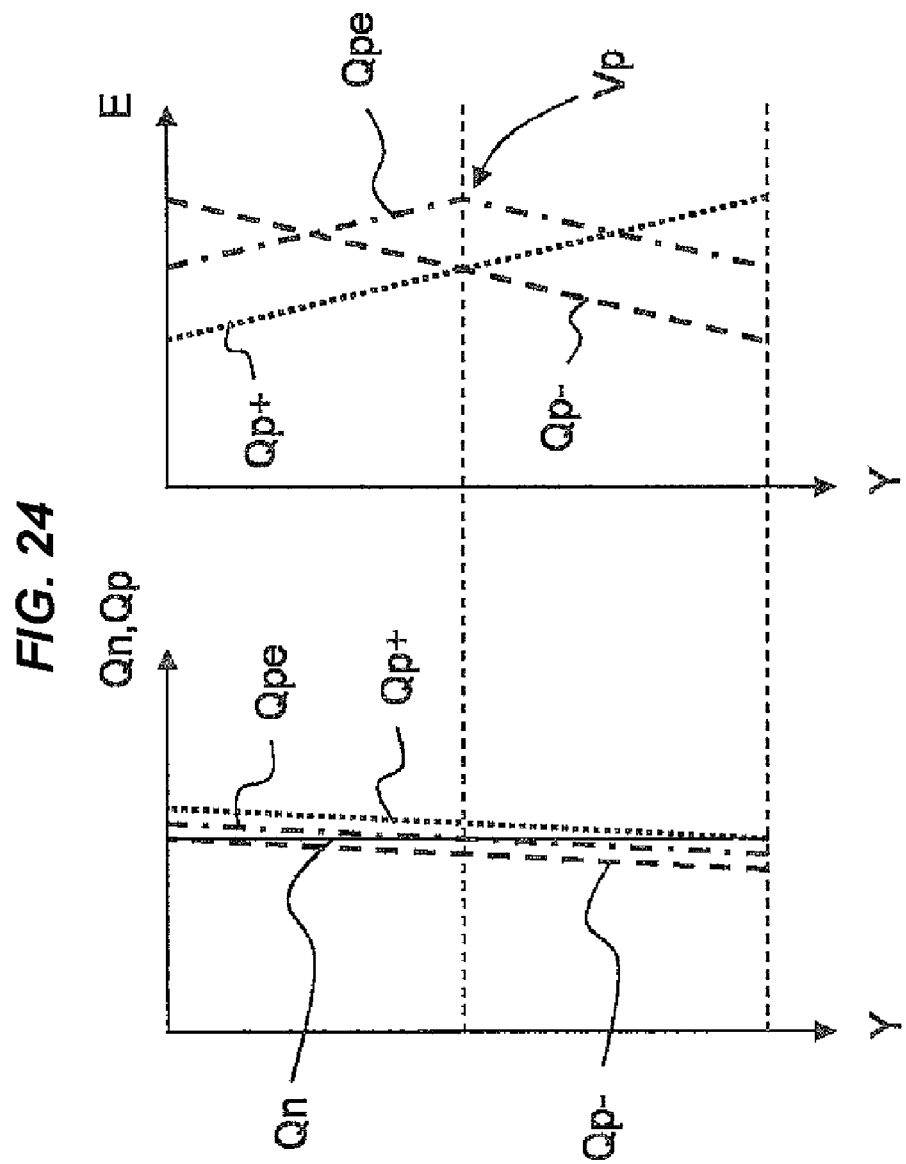
FIG. 24 is an explanatory diagram for explaining the loss of charge balance and the mutual relationship between voltage strength peak position and breakdown voltage in the case where the structure is a vertical column structure and the impurity profiles of the N column and the P column are substantially uniformed in the depth direction.
Figure 25:
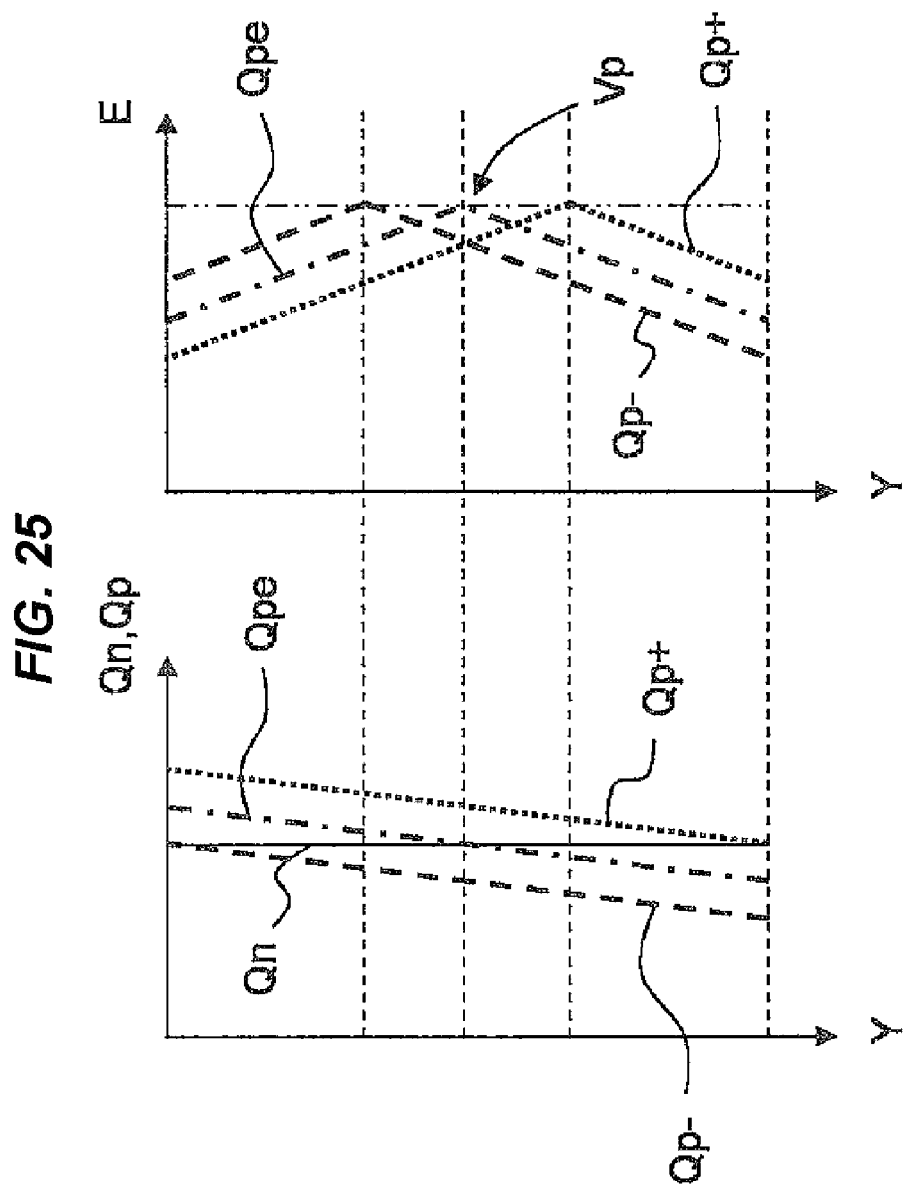
FIG. 25 is an explanatory diagram for explaining the loss of charge balance and the mutual relationship between voltage strength peak position and breakdown voltage in the case where the impurity profiles are substantially uniformed in the depth direction and the column is a normally inclined column.
Figure 26:
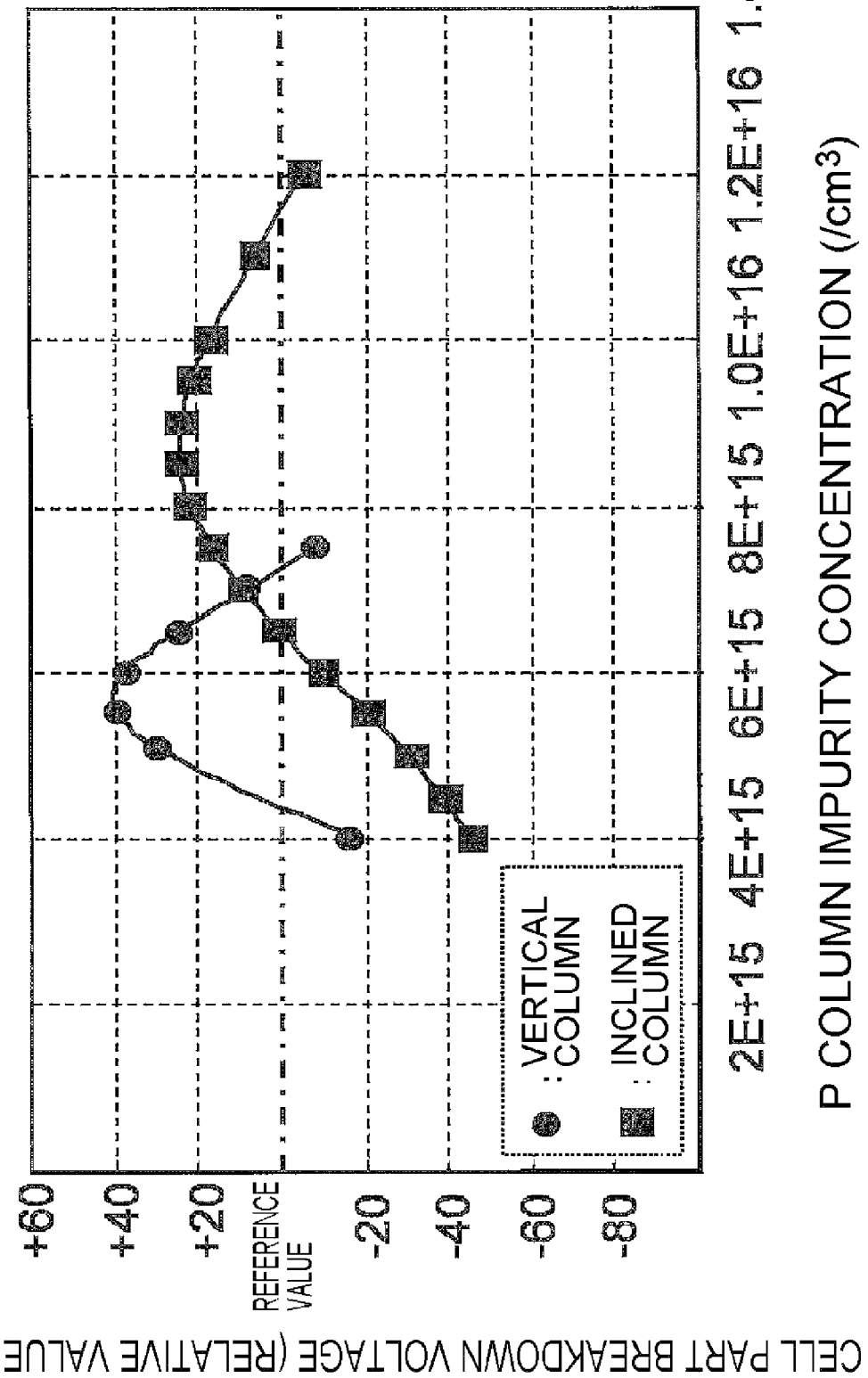
FIG. 26 is a data plot diagram showing the relationship between cell part breakdown voltage and fluctuations in P column impurity amount in the case where the impurity profiles are substantially uniformed in the depth direction and the column is the normally inclined column.
Figure 27:
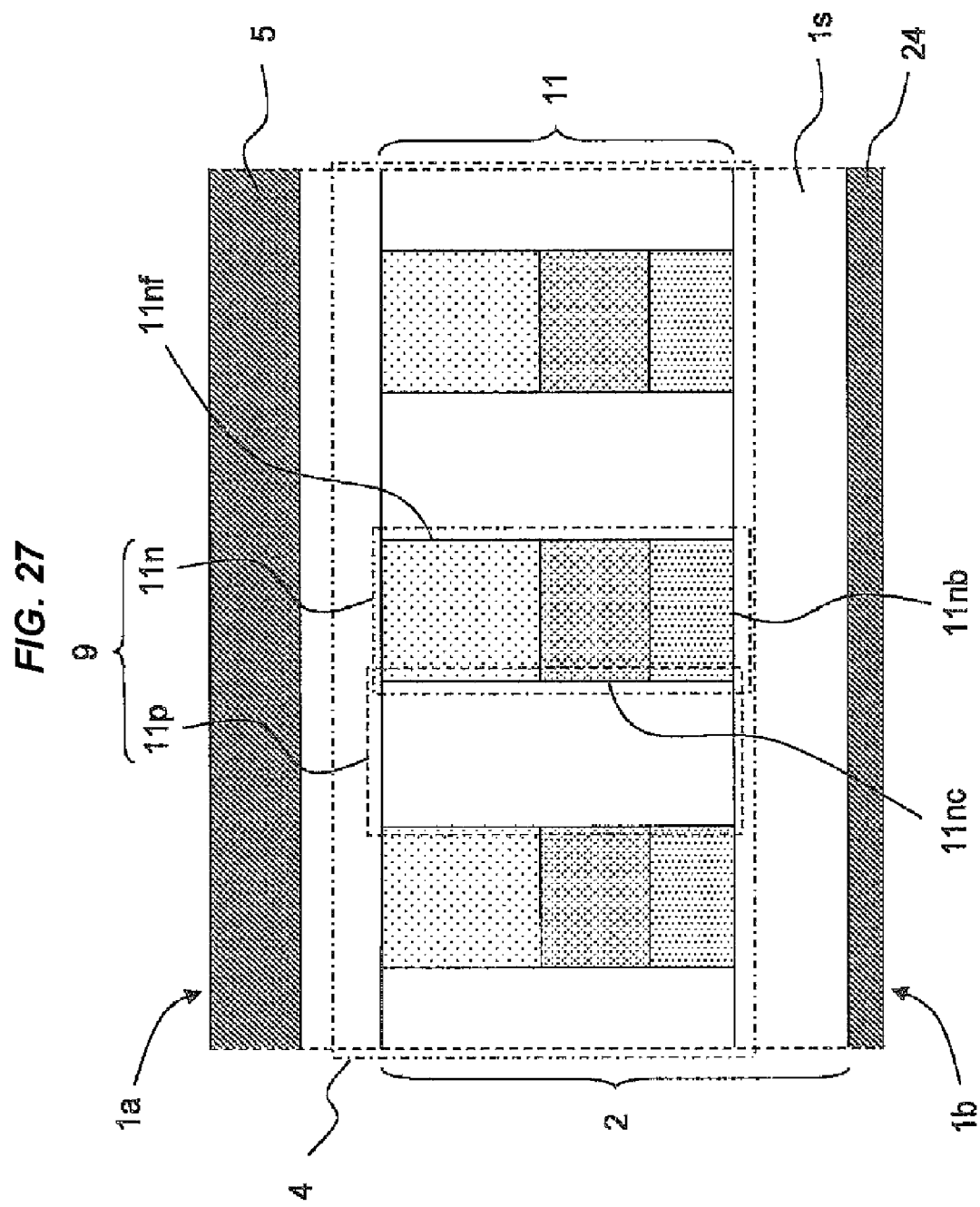
FIG. 27 is a device schematic cross-sectional view corresponding to FIG. 3 for explaining the outline of the vertical power MOSFET of the one embodiment of the present application.
Figure 28:
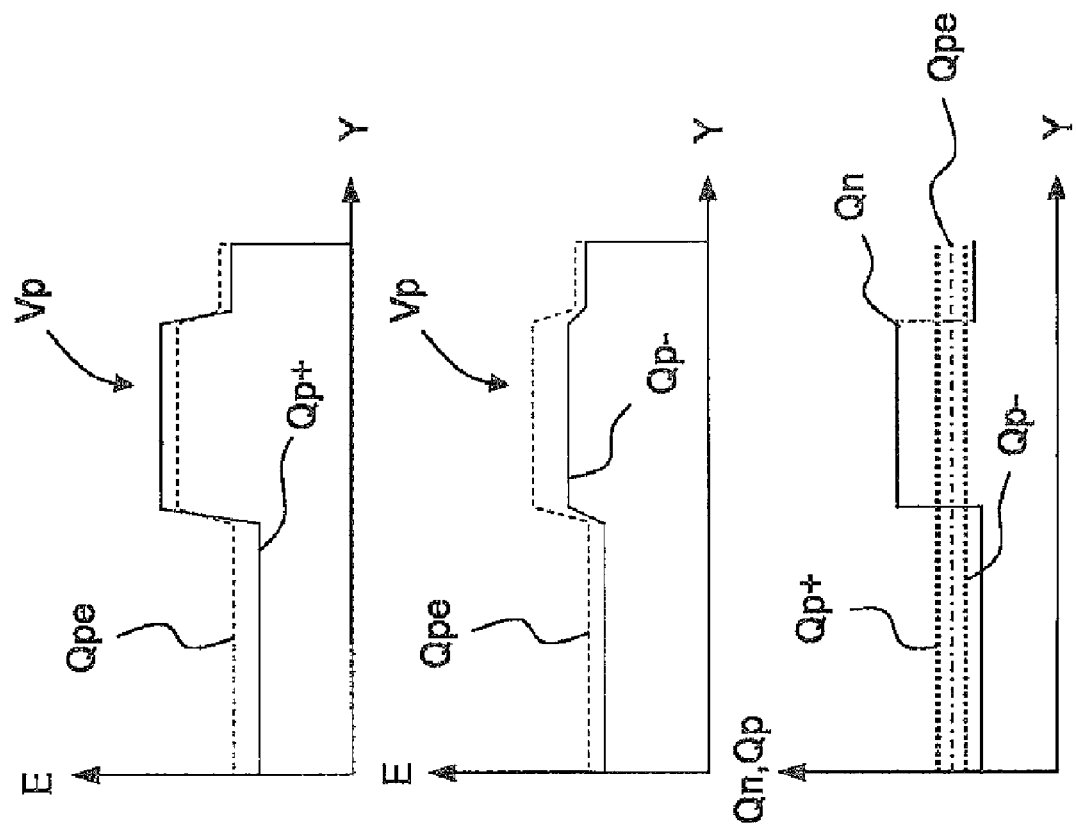
FIG. 28 is an explanatory diagram for explaining the loss of charge balance and the mutual relationship between voltage strength peak position and breakdown voltage in the example in FIG. 3.
Figure 29:
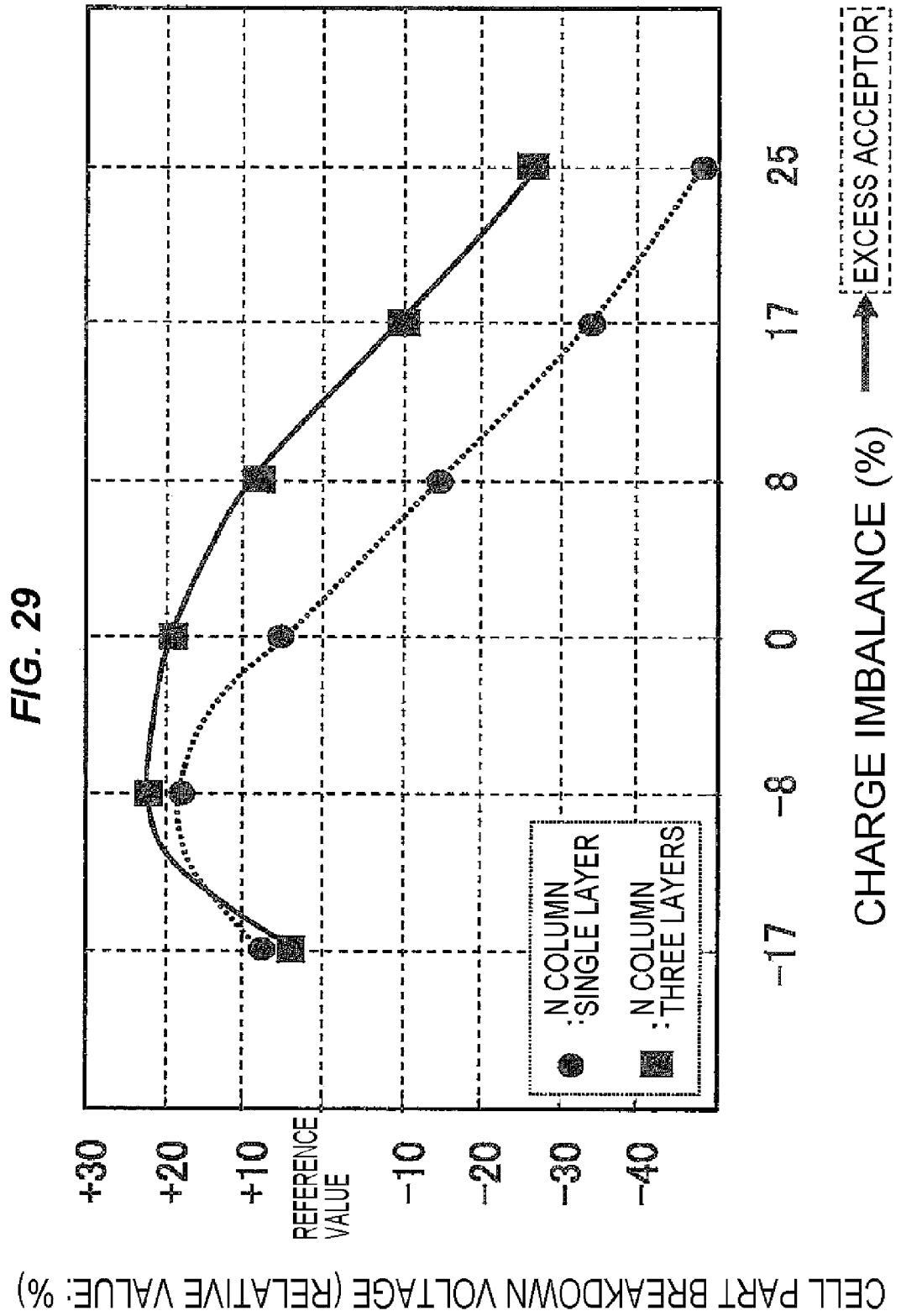
FIG. 29 is a data plot diagram showing the mutual relationship between loss of charge balance and breakdown voltage relating to the example in FIG. 3 and a comparative example (in which the N column is formed into the single layer structure in FIG. 3).

FIG. 24 is an explanatory diagram for explaining the loss of charge balance and the mutual relationship between voltage strength peak position and breakdown voltage, in the case where the structure is a vertical column structure and the impurity profiles of the N column and the P column are substantially uniformed in the depth direction. FIG. 25 is an explanatory diagram for explaining the loss of charge balance and the mutual relationship between voltage strength peak position and breakdown voltage, in the case where the impurity profiles are substantially uniformed in the depth direction and the column is a normally inclined column. FIG. 26 is a data plot diagram showing the relationship between cell part breakdown voltage and fluctuations in P column impurity amount, in the case where the impurity profiles are substantially uniformed in the depth direction and the column is the normally inclined column. FIG. 27 is a device schematic cross-sectional view corresponding to FIG. 3 for explaining the outline of the vertical power MOSFET of the one embodiment of the present application. FIG. 28 is an explanatory diagram for explaining the loss of charge balance and the mutual relationship between voltage strength peak position and breakdown voltage in the example in FIG. 3. FIG. 29 is a data plot diagram showing the mutual relationship between loss of charge balance and breakdown voltage, relating to the example in FIG. 3 and a comparative example (in which the N column is formed into the single layer structure in FIG. 3). On the basis of these, the complementary explanation relating to the embodiment (including the modifications) and the consideration of the whole are given.

(1) Examination on the Technical Problem Along with the Improvement of Breakdown Voltage by the Present Inventors (See Mainly FIG. 24 to FIG. 26):

In the super junction structure of the vertical power MOSFET, in the case where the truly vertical column is used, there is a problem in which even if the charge imbalance increases somewhat, the breakdown voltage or the like deteriorates rapidly as shown in FIG. 24. Here, the slight inclination of the concentration distribution of the P-type impurities results from the fact that the thermal processing time at the time of embedded epitaxial growth is different depending on depth.

In contrast to this, for the product whose breakdown voltage is comparatively low, that is, for the product whose drift area is thin, there exists a method for avoiding deterioration in breakdown voltage or the like by tapering the trench to form a normally inclined column and by bringing each half pitch of the super junction into a state where the P column horizontal half cross-sectional total charge amount Qp is larger than the N column horizontal half cross-sectional total charge amount Qn as shown in FIG. 25 and FIG. 26. By doing so, even if the charge imbalance fluctuates somewhat, the deviation of the electric field strength peak Vp remains within a comparatively small range and the area under the line of the graph corresponding to the breakdown voltage does not change largely.

However, for the product whose breakdown voltage is comparatively high (for example, the breakdown voltage is 300 volts or more), the adoption of the normally inclined column causes the remarkable reduction in the degree of integration because the drift area is thick, and thus this cannot be applied. Furthermore, even the product whose breakdown voltage is comparatively low has a problem of not being able to be miniaturized, or the like. Consequently, from a practical point of view, it is advantageous to adopt the vertical column or the minutely inclined column. Moreover, in a trench etching, the adoption of the normally inclined column is equivalent to the condition of thinning of the sidewall protective film, and thus there may cause a problem in which the variations in the taper angle and dimension become large.

(2) Explanation of the Outline of the Vertical Power MOSFET of the One Embodiment of the Present Application (See Mainly FIG. 27):

Therefore, in the vertical power MOSFET of the one embodiment of the present application, as shown in FIG. 27, the concentration distribution is introduced in the substrate epitaxy column area $11n$ of the substrate epitaxy column area $11n$ and the embedded epitaxy column area $11p$, configuring the super junction. That is, the substrate epitaxy column area $11n$ is caused to have at least the intermediate substrate epitaxy column area $11nc$ located in the intermediate area in the depth direction of the semiconductor substrate 2, the upper substrate epitaxy column area $11nf$ located on the side closer to the surface than the former, and the lower substrate epitaxy column area $11nb$ located on the side closer to the back side than the intermediate substrate epitaxy column area $11nc$ located in the intermediate area. In addition, in the intermediate substrate epitaxy column area $11nc$, the impurity concentration is made more than that of other portions within the substrate epitaxy column area $11n$ to which the intermediate substrate epitaxy column area $11nc$ belongs.

Because of the above, even when the charge imbalance is caused, it is possible to increase the avalanche resistance because the maximum electric field point is located in a deep position of the column.

In contrast to this, in the case of the general substrate epitaxy column area $11n$ having a uniform concentration, even if the charge imbalance increases somewhat, the maximum electric field point moves to the surface side or the like of the substrate and the positive feedback is likely to be generated between the avalanche breakdown and the surface vicinity parasitic transistor and the source-drain breakdown voltage tends to deteriorate rapidly.

(3) Complementary Explanation about the Effect Obtained by Making the Concentration in the Intermediate Portion More than that in Other Portions in the Depth Direction of the N Column or the Like (See Mainly FIG. 28):

FIG. 28 shows the charge distribution as to the half pitch of the super junction and the relationship between charge balance fluctuation and breakdown voltage, in the device structure (however, as the column structure, the vertical column is adopted) in FIG. 3. As shown in FIG. 28 (at the lower side), in this structure, the peak of the donor concentration exceeding the fluctuation width of the charge balance exists in the deep position. Consequently, the electric field strength peak Vp remains in the deep portion of the column even when the charge balance fluctuates normally, and thus the avalanche resistance is not reduced. That is, setting is performed so that, when the avalanche breakdown is generated in any area of a large number of substrate epitaxy column areas, the avalanche breakdown is generated in the intermediate substrate epitaxy column area of the substrate epitaxy column area. By doing so, even if a part of the deep position (intermediate portion in the depth direction) of the cell area enters the avalanche mode, there exists a certain distance from the parasitic bipolar transistor outside the column upper end, and thus the positive feedback is unlikely to be caused therebetween. Consequently, it is unlikely that the temporary operation in the avalanche mode leads to destruction of element.

Meanwhile, the concentration peak or concentration plateau is formed in the intermediate position of the N column as described above because the electric field strength peak Vp is intended to be fixed in the deep position, but when the concentration is made high up to the vicinity of the N+-type drain area 12, the charge balance is lost and the breakdown voltage deteriorates rapidly.

In addition, since the concentration peak or concentration plateau is formed in the intermediate position of the N column, there is an advantage that the on-resistance characteristics are enhanced.

(4) Taper (Minute Taper) Effect of Additional Trench (See Mainly FIG. 29):

When, as in the device structure in FIG. 3, the minutely inclined column is introduced in addition to the multilayer structure of the column-shaped N-type drift area $11n$ (substrate epitaxy column area or N column area), the same effect as that explained in FIG. 25 is added together with the effect explained in FIG. 28. That is, as shown in FIG. 29, due to the synergy effect of the effect of the trapezoidal N column concentration distribution (accurately, the total charge distribution in the depth direction, and this applies hereinafter) by taper and the inverted trapezoidal P column concentration distribution, and the effect of the multilayer structure, compared to the comparative example, the deterioration of breakdown voltage is considerably gradual even if the charge balance fluctuates. Meanwhile, in the comparative example, the multilayer N column of the device structure in FIG. 3 is formed into a single layer.

Furthermore, when the minutely inclined column is introduced, there is an advantage that the risk of the generation of void or the like can be reduced in the process of the embedded epitaxial growth.

In other words, by the introduction of the minutely inclined column (almost vertical column), it is possible to obtain a similar effect, although the effect is relatively weak, while eliminating the drawbacks of the normally inclined column.

Meanwhile, it is also possible to effectively combine the minutely inclined column with the column side surface ion implantation area 16 in FIG. 16 and FIG. 22.

(5) Complementary Explanation Relating to the Device Structure in FIG. 16 (See FIG. 16 or the Like Mainly):

The effect of the introduction of the column side surface ion implantation area 16 in FIG. 16 is substantially equivalent to the effect explained in FIG. 25. That is, on at least a part of the side surface from the upper end part to the intermediate part of the column-shaped N-type drift area $11n$, the additional P-type impurity area is introduced, and therefore, the N column has the trapezoidal concentration distribution and the P column has the inverted trapezoidal column concentration distribution, as a result. When the taper structure of the column is added to this, the same additional effect as that explained in the sub section (4) is obtained.

Meanwhile, the column side surface ion implantation area 16 can also be applied to the multilayer N column structure as in FIG. 22, which makes it possible to magnify the effect of concentration inclination.

(6) Complementary Explanation about the N Column Multilayer Structure (See Mainly FIG. 3 or the Like):

In the present application, as the N column multilayer structure, the three-layer structure will be taken as an example and explained specifically, but the multilayer structure is not limited to the three-layer structure and an N-layer structure (N3) may be accepted. However, the three-layer structure is the simplest in terms of process. Furthermore, even, for example, in the three-layer structure, the boundary part in each layer changes comparatively continuously, and thus it may also be possible to continuously change a part or the whole, to thereby divide typical values of each part into three. However, in many cases, the continuous change makes the process control difficult.

Furthermore, it is also possible to form the embedded epitaxial growth side into the N-layer structure (N3). However, the formation of the substrate epitaxial growth side into a multilayer structure makes the process control easier.

8. Summary

Hereinbefore, the invention made by the inventors has been specifically explained on the basis of the embodiment, but it is needless to say that the present invention is not limited to the embodiment and can be modified in various ways within a scope not departing from the gist thereof.

For example, in the embodiment, the planar-type power MOSFET has been mainly taken as an example and explained specifically, but it is needless to say that the present invention is not limited to the embodiment and the present invention can also be applied to the trench gate power MOSFET or the like as explained previously in the section 4.

Meanwhile, in the embodiment, as the metal source electrode material, a material using the aluminum-based metal film or the like has been mainly illustrated as an example, but it is needless to say that the present invention is not limited to the embodiment and films of tungsten, copper, gold, silver, titanium, palladium, TiW, TiN, other metals, and alloys (including a composite films) may also be used in addition to the aluminum-based metal film.

Similarly, in the embodiment, as the gate electrode material, the polysilicon film has been mainly taken as an example and explained specifically, but it is needless to say that the present invention is not limited to the embodiment and a silicide film, polycide film, tungsten film, titanium film, metal film, such as TiW, TiN and others, metal nitride film, and alloy film (including a composite film) may also be used in addition to the polysilicon film.

What is claimed is:

1. A vertical power MOSFET comprising:
   (a) a semiconductor substrate having a first main surface and a second main surface;
   (b) a cell area provided extending from the first main surface side to within the inside of the semiconductor substrate;
   (c) a first conductive-type substrate part provided extending from the second main surface of the semiconductor substrate into the inside of the semiconductor substrate;
   (d) a drift area located within the cell area, which extends from an upper end of the first conductive-type substrate part to the first main surface of the semiconductor substrate, and includes a super junction structure;
   (e) a large number of substrate epitaxy column areas having the first conductive type and configuring the super junction structure;
   (f) a large number of embedded epitaxy column areas having a second conductive type opposite to the first conductive type and configuring the super junction structure;
   (g) a metal source electrode provided over the first main surface of the semiconductor substrate; and
   (h) a metal drain electrode provided over the second main surface of the semiconductor substrate,
   wherein each substrate epitaxy column area includes the following areas:
   (e1) an intermediate substrate epitaxy column area located in an intermediate area in the depth direction of the semiconductor substrate;
   (e2) an upper substrate epitaxy column area located closer to the first main surface side than the intermediate substrate epitaxy column area; and
   (e3) a lower substrate epitaxy column area located closer to the second main surface side than the intermediate substrate epitaxy column area,
   wherein within the substrate epitaxy column area an impurity concentration in the intermediate substrate epitaxy column area is more than an impurity concentration in the upper substrate epitaxy column area and more than an impurity concentration in the lower substrate epitaxy column area, and
   wherein the impurity concentration in the lower substrate epitaxy column area is equal to or more than the impurity concentration in the upper substrate epitaxy column area.

2. The vertical power MOSFET according to claim 1, wherein each substrate epitaxy column area is configured such that when avalanche breakdown is generated in any area of the large number of substrate epitaxy column areas, the avalanche breakdown is generated in the intermediate substrate epitaxy column area of the substrate epitaxy column area.

3. The vertical power MOSFET according to claim 2, wherein (y1) the thickness of the upper substrate epitaxy column area in each substrate epitaxy column area is equal to or less than half the total thickness of the substrate epitaxy column area;
   wherein (y2) the thickness of the intermediate substrate epitaxy column area in each substrate epitaxy column area is equal to or more than the thickness of the lower substrate epitaxy column area; and
   wherein (y3) the thickness of the intermediate substrate epitaxy column area in each substrate epitaxy column area is equal to or less than the thickness of the upper substrate epitaxy column area.

4. The vertical power MOSFET according to claim 3, wherein at least a part of a side surface from an upper end part to an intermediate part in each substrate epitaxy column area is provided with a column side surface ion implantation area having the second conductive type.

5. The vertical power MOSFET according to claim 3, wherein each substrate epitaxy column area has a taper angle of not less than 88.6 degrees and not more than 89.6 degrees.

6. The vertical power MOSFET according to claim 3, wherein each substrate epitaxy column area has a taper angle of not less than 88.6 degrees and not more than 89.3 degrees.

7. The vertical power MOSFET according to claim 5, wherein the semiconductor substrate is a silicon-based semiconductor substrate.

8. A vertical power MOSFET comprising:
   (a) a semiconductor substrate having a first main surface and a second main surface;
   (b) a cell area provided extending from the first main surface side to within the inside of the semiconductor substrate;
   (c) a first conductive-type substrate part provided extending from the second main surface of the semiconductor substrate into the inside of the semiconductor substrate;
   (d) a drift area located within the cell area, which extends from an upper end of the first conductive-type substrate part to the first main surface of the semiconductor substrate, and includes a super junction structure;

(e) a large number of substrate epitaxy column areas having the first conductive type and configuring the super junction structure;

(f) a large number of embedded epitaxy column areas having a second conductive type opposite to the first conductive type and configuring the super junction structure;

(g) a metal source electrode provided over the first main surface of the semiconductor substrate; and (h) a metal drain electrode provided over the second main surface of the semiconductor substrate, wherein each substrate epitaxy column area includes:

an intermediate substrate epitaxy column area located in an intermediate area in the depth direction of the semiconductor substrate;

an upper substrate epitaxy column area located closer to the first main surface side than the intermediate substrate epitaxy column area; and a lower substrate epitaxy column area located closer to the second main surface side than the intermediate substrate epitaxy column area, and wherein in each substrate epitaxy column area, at least a part of a side surface from an upper substrate epitaxy column area to an intermediate substrate epitaxy column area part is provided with a column side surface ion implantation area having the second conductive type, wherein within the substrate epitaxy column area an impurity concentration in the intermediate substrate epitaxy column area is more than an impurity concentration in the upper substrate epitaxy column area and more than an impurity concentration in the lower substrate epitaxy column area, and wherein the impurity concentration in the lower substrate epitaxy column area is equal to or more than the impurity concentration in the upper substrate epitaxy column area.

9. The vertical power MOSFET according to claim 8, wherein each substrate epitaxy column area has a taper angle of not less than 88.6 degrees and not more than 89.6 degrees.

10. The vertical power MOSFET according to claim 8, wherein each substrate epitaxy column area has a taper angle of not less than 88.6 degrees and not more than 89.3 degrees.

11. The vertical power MOSFET according to claim 9, wherein the semiconductor substrate is a silicon-based semiconductor substrate.

* * * * *